(12) United States Patent
Diehl

(10) Patent No.: US 12,315,729 B1
(45) Date of Patent: May 27, 2025

(54) LASER-BASED PROCESSING FOR SEMICONDUCTOR WAFERS

(71) Applicant: Wolfspeed, Inc., Durham, NC (US)

(72) Inventor: Devon Michael Diehl, Durham, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/661,994

(22) Filed: May 13, 2024

(51) Int. Cl.
*H01L 21/268* (2006.01)
*B23K 26/38* (2014.01)
*B23K 26/40* (2014.01)
*H10D 62/832* (2025.01)

(52) U.S. Cl.
CPC ............ *H01L 21/268* (2013.01); *B23K 26/38* (2013.01); *B23K 26/40* (2013.01); *H10D 62/8325* (2025.01)

(58) Field of Classification Search
CPC ... B23K 26/38; B23K 26/40; H01L 21/02035; H01L 21/02021; H01L 21/02032
See application file for complete search history.

(56) References Cited

U.S. PATENT DOCUMENTS

| | | | |
|---|---|---|---|
| 10,562,130 B1 | 2/2020 | Donofrio et al. | |
| 10,611,052 B1 * | 4/2020 | Bubel | H01L 29/1608 |
| 11,826,846 B2 | 11/2023 | Donofrio et al. | |
| 2004/0191927 A1 * | 9/2004 | Park | H10B 12/50 257/E21.018 |
| 2015/0332910 A1 * | 11/2015 | Morikazu | H01L 21/02013 438/798 |
| 2019/0148132 A1 * | 5/2019 | Horita | B28D 5/021 438/463 |
| 2021/0198804 A1 | 7/2021 | Khlebnikov et al. | |
| 2022/0108882 A1 * | 4/2022 | Tsuchiya | H01L 21/6836 |
| 2022/0189768 A1 | 6/2022 | Khlebnikov et al. | |
| 2022/0403552 A1 | 12/2022 | Leonard et al. | |
| 2024/0136174 A1 * | 4/2024 | Wu | H01L 21/02021 |

FOREIGN PATENT DOCUMENTS

| | | | |
|---|---|---|---|
| CN | 114178981 A | * | 3/2022 |
| KR | 101816191 B1 | * | 1/2018 |

OTHER PUBLICATIONS

Aminoroaya et al., "A Review of Dental Composites: Challenges, Chemistry Aspects, Filler Influences, and Future Insights", Composites Part B: Engineering, vol. 216, No. 108852, 2021, pp. 1-23.

(Continued)

*Primary Examiner* — Evan G Clinton
(74) *Attorney, Agent, or Firm* — Dority & Manning, P.A.

(57) ABSTRACT

An example method includes providing a first semiconductor workpiece including a first portion and a second portion. The example method includes providing emission of one or more lasers through a thickness of the first semiconductor workpiece to remove the first portion of the first semiconductor workpiece from the second portion. In some implementations, the second portion has a shape corresponding to a second semiconductor workpiece of a different diameter relative to the first semiconductor workpiece.

19 Claims, 14 Drawing Sheets

(56) References Cited

OTHER PUBLICATIONS

Chen et al., "Effect of Laser Incidence Angle on the Femtosecond Laser Ablation Characteristics of Silicon Carbide Ceramics", Optics and Lasers in Engineering, vol. 172, No. 107849, 2024, pp. 1-18.
Cho et al., "Dental Resin Composites: A Review on Materials to Product Realizations", Composites Part B: Engineering, vol. 230, No. 109495, 2022, 65 pages.
Jeevamalar et al., "Die Sinking EDM Process Parameters: A Review", International Journal of Mechanical Engineering and Robotics Research, vol. 4, No. 1, Jan. 2015, pp. 315-326.
Kinashi et al., "UV-Assisted Deposition of TEOS SiO2 Films Using the Spin-Coating Method", Applied Surface Science, vol. 79-80, 1994, pp. 332-337.
Li et al., "Surface Micromorphology and Nanostructures Evolution in Hybrid Laser Processes of Slicing and Polishing Single Crystal 4H—SiC", Journal of Materials Science & Technology, vol. 184, 2024, pp. 235-244.
Moszner et al., "New Developments of Polymeric Dental Composites", Progress in Polymer Science, vol. 26, Issue 4, 2001, pp. 535-576.
Theissmann et al., "High Performance Low Temperature Solution-Processed Zinc Oxide Thin Film Transistor", Thin Solid Films, vol. 519, Issue 16, 2011, pp. 5623-5628.
Zhu et al., "Electrical Discharge Machining of Semiconductor Materials: A Review", Journal of Materials Research and Technology, vol. 25, Jun. 2023, pp. 4354-4379.
Geng et al., "Slicing of 4H—SiC Wafers Combining Ultrafast Laser Irradiation and Bandgap-Selective Photo-Electrochemical Exfoliation", Advanced Materials Interfaces, vol. 10, No. 2300200, 2023, pp. 1-7.
Kim et al., "4H—SiC Wafer Slicing by Using Femtosecond Laser Double-Pulses", Optical Materials Express, vol. 7, No. 7, Jul. 1, 2017, pp. 2450-2460.
Zhang et al., "A Review of Femtosecond Laser Processing of Silicon Carbide", MDPI Micromachines, vol. 15, No. 639, May 10, 2024, pp. 1-26.

* cited by examiner

LASER-BASED PROCESSING FOR SEMICONDUCTOR WAFERS

FIELD

The present disclosure relates generally to semiconductor fabrication, and more particularly to processing of semiconductor workpieces, such as semiconductor wafers or boules, such as wide bandgap semiconductor wafers or boules, such as silicon carbide semiconductor wafers or boules.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices.

Power semiconductor devices may be packaged into various semiconductor device packages, such as discrete semiconductor device packages and power modules. Power modules may include one or more power devices and other circuit components and can be used, for instance, to dynamically switch large amounts of power through various components, such as motors, inverters, generators, and the like.

Semiconductor devices may be fabricated from wide bandgap semiconductor materials, such as silicon carbide and/or Group III nitride-based semiconductor materials. The fabrication process for power semiconductor devices may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

In an aspect, the present disclosure provides an example method. In some implementations, the example method includes providing a first semiconductor workpiece comprising a first portion and a second portion. In some implementations, the example method includes providing emission of one or more lasers through a thickness of the first semiconductor workpiece to remove the first portion of the first semiconductor workpiece from the second portion. In some implementations, the second portion has a shape corresponding to a second semiconductor workpiece of a different diameter relative to the first semiconductor workpiece.

In an aspect, the present disclosure provides an example method of processing a first semiconductor workpiece. In some implementations, the example method includes obtaining data indicative of a workpiece property. In some implementations, the example method includes determining one or more laser parameters based on the workpiece property. In some implementations, the example method includes providing emission of one or more lasers through a thickness of the first semiconductor workpiece to remove a first portion of the first semiconductor workpiece from a second portion of the first semiconductor workpiece based at least in part on the laser parameters.

In an aspect, the present disclosure provides an example system. In some implementations, the example system includes a laser source configured to emit a laser to remove semiconductor material from a first semiconductor workpiece. In some implementations, the example system includes a translation stage operable to impart relative motion between the first semiconductor workpiece and the laser. In some implementations, the example system includes a sensor operable to obtain data indicative of a workpiece property. In some implementations, the example system includes a controller configured to perform operations, the operations including controlling the laser source to emit the laser through a thickness of the first semiconductor workpiece to remove a first portion of the first semiconductor workpiece from a second portion based at least in part on one or more laser parameters.

In an aspect, the present disclosure provides an example cored semiconductor wafer. In some implementations, the example cored semiconductor wafer includes a silicon carbide. In some implementations, the example cored semiconductor wafer includes an outer surface formed from a coring operation using one or more lasers, the outer surface having a flared edge such that a bottom portion of the outer surface is wider than a top portion of the outer surface.

In an aspect, the present disclosure provides an example method for fabricating a semiconductor workpiece. In some implementations, the example method includes providing a first semiconductor workpiece comprising a first portion and a second portion. In some implementations, the example method includes removing the first portion of the first semiconductor workpiece from the second portion using a non-contact-based tool. In some implementations of the example method, the second portion has a shape corresponding to a second semiconductor workpiece of a different diameter relative to the first semiconductor workpiece.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
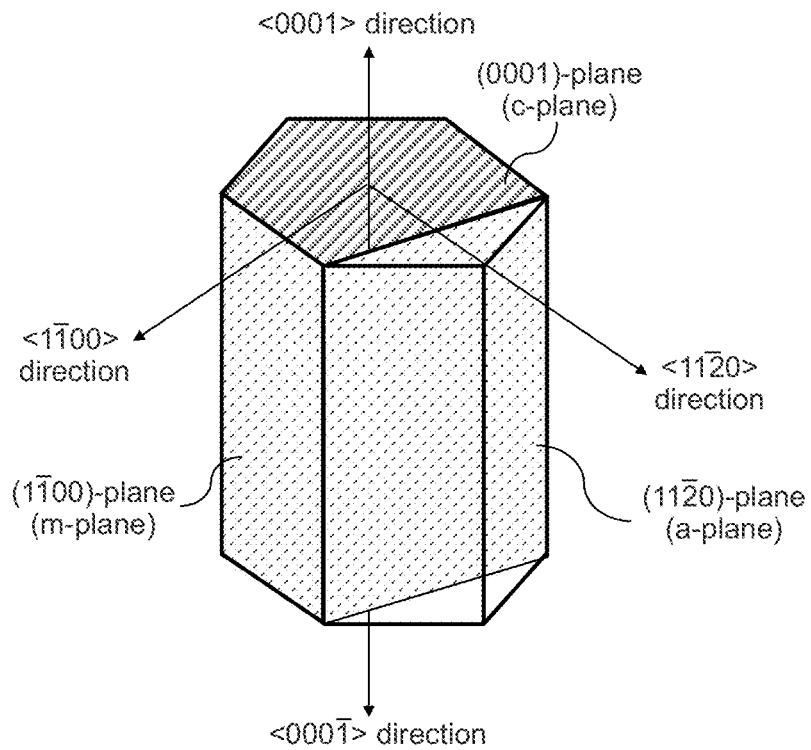
FIG. 1 is a first perspective view crystal plane diagram showing the coordinate system for a hexagonal crystal such as 4H-SiC.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride-based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the power semiconductor devices according to example embodiments of the present disclosure may be used with any semiconductor material, such as other wide bandgap semiconductor materials and other semiconductor materials (e.g., silicon), without deviating from the scope of the present disclosure. Example wide bandgap semiconductor materials include silicon carbide and the Group III-nitrides.

Power semiconductor devices may be fabricated using epitaxial layers formed on a semiconductor workpiece, such as a silicon carbide semiconductor wafer. Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 mm, such as greater than about 5 mm, such as greater than about 10 millimeters, such as greater than about 20 millimeters, such as greater than about 50 millimeters, such as greater than about 100 millimeters, such as greater than about 200 millimeters, etc.

In some examples, the semiconductor workpiece includes silicon carbide crystalline material. The silicon carbide crystalline material may have a 4H crystal structure, 6H crystal structure, or other crystal structure. The semiconductor workpiece can be an on-axis workpiece (e.g., end face parallel to the (0001) plane) or an off-axis workpiece (e.g., end face non-parallel to the (0001) plane).

Aspects of the present disclosure may make reference to a surface of the semiconductor workpiece. In some examples, the surface of the workpiece may be, for instance, a silicon face of the workpiece. In some examples, the surface of the workpiece may be, for instance, a carbon face of the workpiece.

An ingot or boule refers to a large portion of semiconductor material used in forming semiconductor substrates, commonly semiconductor wafers. A boule may be part of an epitaxially grown crystalline semiconductor material, for example, a wide bandgap semiconductor material. Specifically, in some examples, a boule may include a large portion of epitaxially grown silicon carbide (e.g., 4H silicon carbide) or Group III-nitride. A substrate or semiconductor wafer may be formed from a portion of semiconductor material removed from a boule. The terms "ingot" and "boule" may be used interchangeably in the present disclosure.

In some examples, a semiconductor wafer may be a solid semiconductor workpiece upon which semiconductor device fabrication may be implemented. A semiconductor wafer may be a homogenous material, such as silicon carbide, and may provide mechanical support for the formation and/or carrying of additional semiconductor layers (e.g., epitaxial layers), metallization layers, and other layers to form one or more semiconductor devices. In some examples, a semiconductor wafer may have a thickness in a range of about 0.5 microns to about 1000 microns or greater, such as in a range of about 150 microns to about 400 microns, such as in a range of about 250 microns to about 350 microns. In some examples, the semiconductor wafer may include a thin semiconductor layer (e.g., about 0.5 microns or less, such as 0.1 microns to about 0.5 microns) on a carrier substrate.

A semiconductor wafer may be characterized by a plurality of surfaces. For example, a semiconductor wafer may have a "first major surface" and a "second major surface." The first major surface may be generally opposite the second major surface. The first and second major surfaces may be generally parallel to one another. A semiconductor wafer may also have a "side surface" corresponding to a surface extending between the two major surfaces. For example, the side surface may extend between the first major surface and the second major surface.

Power semiconductor device fabrication processes may include forming semiconductor wafers from boules. One example removal process may include, for instance, cutting thin layers (e.g., wafers) from the boule using wire saws. Another example removal process for forming semiconductor wafers from boules may include a laser-based removal process. Laser-based removal processes may include providing subsurface laser damage patterns to a boule to form weakened areas in the boule. Portions may then be separated from the boule along the weakened areas to produce semiconductor wafers. Separation processes may include, for example, ultrasonic fracturing, mechanical force fracturing, or other fracturing methods.

Current methods for fabricating power semiconductor devices from semiconductor material boules may incur significant expense. For example, the process of epitaxially growing the semiconductor boule can be quite costly due to the need for expensive processing equipment and carefully controlled processing conditions. Additionally, due to the structural properties of crystalline boules, current methods of separating or fracturing substrates or wafers from a boule may be expensive.

This expense may be exacerbated by the presence of defects in the semiconductor material boules or the resulting wafer. For example, a wafer separated from a boule may contain any manner of defects or anomalies, including crystal growth defects, edge chip defects, and/or over-edge grind defects. When a semiconductor wafer includes one or more of these defects, the wafer may be discarded as scrap or waste. This increases the cost of fabricating semiconductor devices as fewer wafers can be formed from a given boule. However, many of these defects only affect a portion of the semiconductor wafer.

Aspects of the present disclosure are directed to using a laser-based system for coring semiconductor workpieces. For instance, aspects of the present disclosure are directed to a method coring semiconductor workpieces including providing a first semiconductor workpiece having a first portion and a second portion. The method may include providing emission of one or more lasers through a thickness of the first semiconductor workpiece to remove the first portion of the first semiconductor workpiece from the second portion. As such, the second portion has a shape corresponding to a second semiconductor workpiece of a different diameter relative to the first semiconductor workpiece. Thus, the first portion, which may contain one or more defects (e.g., crystal growth defects, edge chip defects, over-edge grind defects, etc.) can be scrapped and the second portion, which may generally be free of defects, can be further processed to fabricate semiconductor devices, such as MOSFETs, IGBTs, Schottky diodes, HEMTs, or other semiconductor devices.

In some embodiments, the first semiconductor workpiece may be a wide bandgap semiconductor workpiece, such as a silicon carbide semiconductor workpiece (e.g., 4H silicon carbide, 6H silicon carbide) or a Group III-nitride semiconductor workpiece. For instance, in some embodiments, the first semiconductor workpiece may be a semiconductor wafer. Specifically, in one example, the first semiconductor wafer may be a finished wafer or an unfinished wafer. In other embodiments, the first semiconductor workpiece may be a semiconductor boule.

As indicated above, the second semiconductor workpiece has a different diameter relative to the first semiconductor workpiece. In one example, the first semiconductor workpiece has a diameter of about 200 mm and the second semiconductor workpiece has a diameter of about 150 mm. In another example, the first semiconductor workpiece has a diameter of about 150 mm and the second semiconductor workpiece has a diameter of about 100 mm. In a further example, the first semiconductor workpiece has a diameter of about 200 mm and the second semiconductor workpiece has a diameter of about 100 mm.

Furthermore, in some examples, the method may include laser-based coring or removing of semiconductor material through a thickness of the first semiconductor workpiece with one or more lasers to provide the separation of the first portion of the first semiconductor workpiece from the second portion, thereby creating the second semiconductor workpiece. The lasers may be operated in accordance with one or more laser parameters.

In some examples, the laser-based coring of the first semiconductor workpiece may be implemented in accordance with the following laser parameters:

Laser wavelength: about 500 nanometers to about 1100 nanometers, such as about 532 nanometers, such as about 1064 nanometers, such as about 1080 nanometers;

Pulse frequency: about 1 kilohertz to about 200 kilohertz, such as about 10 kilohertz to about 150 kilohertz, such as about 20 kilohertz to about 100 kilohertz;

Laser power: 0.1 watts to about 500 watts, such as about 0.5 watts to about 100 watts, such as about 1 watt to about 40 watts, such as about 1 watt to about 10 watts;

Laser pulse duration: about 0.1 femtoseconds to about 300 nanoseconds; such as about 1 femtosecond to about 150 nanoseconds, such as about 1 femtosecond to about 100 nanoseconds;

Translation speed: about 0 millimeter per second to about 2 meters per second, such as about 1 millimeter per second to about 1 meter per second;

Focusing depth: about 0 microns to about 1500 microns (beneath the surface of the workpiece), such as about 0 microns to about 1000 microns (beneath the surface of the workpiece), such as about 1 micron to about 100 microns (beneath the surface of the workpiece); and Laser Pulse Energy: about 1 nanojoule to about 2 joules, such as about 10 nanojoules to about 200 millijoules.

In some examples, to perform the laser-based coring of the first semiconductor workpiece, relative motion (e.g., translation or rotation) may be imparted between the first semiconductor workpiece and the one or more lasers being emitted through the thickness of the first semiconductor wafer. It should be appreciated that both moving the one or more lasers relative to the first semiconductor workpiece (e.g., through a translation stage and/or one or more optical devices, such as lenses, mirrors, etc.) and moving the first semiconductor workpiece relative to the one or more lasers may fall within the scope of the present disclosure.

In some examples, various laser parameters associated with the laser-based coring operations may be adjusted, changed, or tuned depending on the materials and other parameters of the first semiconductor workpiece. In some examples, to adjust the one or more laser parameters, data may be obtained regarding the first semiconductor workpiece and/or the material of the first semiconductor workpiece before, during, and/or after the coring process. The data may include, for instance, workpiece property data that provides data associated with a surface of the first semiconductor workpiece (e.g., topography, roughness), subsurface regions of the first semiconductor workpiece, optical properties of the first semiconductor workpiece, temperature of the first semiconductor workpiece, doping level of the first semiconductor workpiece, polytype of the first semiconductor workpiece (e.g., 4H, 6H), or other parameters. For instance, the workpiece property data may be obtained using one or more sensors. In some examples, the workpiece property data may include data associated with a surface topography of the first semiconductor workpiece. In some examples, the workpiece property data may include an image of a surface of the first semiconductor workpiece obtained using an optical sensor or image capture device. In some examples, a scan of the surface may be obtained using one or more surface measurement lasers or other optical devices. In some examples, an image may be captured of the surface and analyzed using computer image processing techniques (e.g., classifier models, such as machine-learned classifier models) to determine data indicative of workpiece properties, such as the presence of anomalies, defects, roughness, topography, optical properties, etc.

Moreover, in some examples, determining the various laser parameters includes identifying the first portion of the first semiconductor workpiece based on the workpiece property data. Thereafter, a cut line separating the first portion from the second portion can be determined based at least in part on the identification of the first portion. The cut line may, in turn, be used to guide the relative movement between the first semiconductor workpiece and the one or more lasers to implement the laser-based coring operation according to examples of the present disclosure.

In some embodiments, the laser parameters may be specified as a function of position on the first semiconductor workpiece (e.g., the parameters are modified and changed based on position of the one or more lasers on the workpiece). The laser parameters may be adjusted and/or selected as a function of position on the workpiece. For instance, the laser parameters at a first position with certain characteristics may be different from the laser parameters at a second position with different characteristics.

In some embodiments, after providing emission of the one or more lasers through the thickness of the first semiconductor workpiece (such that the first and second portions of the first semiconductor workpiece are separated), an outer surface of the second semiconductor workpiece has a flared edge. For example, after providing emission of the one or more lasers, grinding of the outer surface of the second semiconductor workpiece may be performed. Such grinding the outer surface of the second semiconductor workpiece reduces the diameter of the second semiconductor wafer to a finished workpiece diameter.

Aspects of the present disclosure are additionally directed to systems for implementing the methods discussed herein. For instance, aspects of the present disclosure relate to a laser processing system for processing semiconductor workpieces. The laser processing system includes one or more laser sources configured to emit a laser configured to remove material from a first semiconductor workpiece and at least one translation stage that may impart relative motion between the at least one laser and the first semiconductor workpiece. In some embodiments, the translation stage may move (e.g., translate and/or rotate) the lasers and/or the first semiconductor workpiece relative to one another. In some embodiments, the translation stage includes one or more optics (e.g., mirrors) along one or more axes configured to move or scan the laser relative to the first semiconductor workpiece.

Additionally, in some examples, the system may include at least one sensor and a controller. The sensor(s) may be operable to obtain data associated with one or more workpiece properties. For instance, the sensor may be an optical sensor, image capture device, or one or more surface measurement lasers. The sensor(s) may be used to determine, for instance, a surface topography of at least a portion of the first semiconductor workpiece. The controller may receive data from the at least one sensor and determine one or more laser parameters based on the workpiece property data. The controller may control the laser to remove the semiconductor material separating the first portion of the first semiconductor workpiece from the second portion based, at least in part, on the laser parameters. As an example, the laser parameters may be specified as a function of position on the first semiconductor workpiece. The laser parameters may include, for instance, focusing depth, laser power, laser wavelength, laser pulse duration, laser pulse frequency, laser pulse energy, laser scan pattern, etc. In some embodiments, the controller may be additionally configured to operate the translation stage to impart relative motion between the laser and the surface of the first semiconductor workpiece.

Aspects of the present disclosure are further directed to a cored semiconductor wafer. The cored semiconductor wafer may include silicon carbide (e.g., 4H silicon carbide, 6H silicon carbide, etc.). The cored semiconductor wafer may include an outer surface formed from a coring operation using one or more lasers. The coring operation, in turn, includes providing emission of one or more lasers through a thickness of a semiconductor wafer to remove the first portion of the first semiconductor wafer from the second portion, thereby resulting in the formation of the cored semiconductor wafer. As such, the outer surface may have a flared edge such that a bottom portion of the outer surface is wider than a top portion of the outer surface. This flared edge may be removed via grinding, as described above. In some instances, the cored semiconductor wafer has a diameter of about 150 mm. In some instances, the cored semiconductor wafer has a diameter of about 100 mm.

Aspects of the present disclosure are further directed to a method for coring semiconductor workpieces including providing a first semiconductor workpiece having a first portion and a second portion. The method may include removing the first portion of the first semiconductor workpiece from the second portion using a non-contact-based tool. As such, the second portion has a shape corresponding to a second semiconductor workpiece of a different diameter relative to the first semiconductor workpiece. Thus, the first portion, which may contain one or more defects (e.g., crystal growth defects, edge chip defects, over-edge grind defects, etc.) can be scrapped and the second portion, which may generally be free of defects, can be further processed to fabricate semiconductor devices, such as MOSFETs, IGBTs, Schottky diodes, HEMTs, or other semiconductor devices.

In some embodiments, the non-contact-based tool includes one or more laser sources. Thus, in such embodiments, removing the first portion of the first semiconductor workpiece from the second portion can include ablating semiconductor material of the first semiconductor workpiece separating the first portion and the second portion with one or more lasers emitted from the one or more laser sources.

In other embodiments, the non-contact-based tool includes an electrode head of an electrical discharge machining (EDM) system. Thus, in such embodiments, removing the first portion of the first semiconductor workpiece from the second portion includes exposing the first semiconductor workpiece to one or more electrical discharges from the electrode head.

Aspects of the present disclosure provide a number of technical effects and benefits. For instance, aspects of the present disclosure allow for a portion of a semiconductor workpiece (e.g., a semiconductor wafer, such as an unfinished wafer or a finished wafer, or a semiconductor boule) containing one or more defects (e.g., crystal growth defects, edge chip defects, over edge grind defects, etc.) to be separated from the remaining portion of the semiconductor workpiece. Thus, the need to discard or otherwise scrap an entire semiconductor workpiece due to the presence of a defect is reduced. By reducing the scrap rate, the cost to manufacture a power semiconductor device is reduced. That is, the cost of growing the boule and separating the wafers from the boule can be amortized over a greater number of semiconductor wafers. As another example, aspects of the present disclosure allow for a larger workpiece containing one or more defects to be cored and formed into a smaller workpiece. For example, a 200 mm wafer or other workpiece containing one or more defects can be formed into a 150 mm wafer or other workpiece using the aspects of the present disclosure. Thus, in such an example, although the wafer or other workpiece may not be suitable for use as a 200 mm wafer or other workpiece, the present disclosure allows for use of the wafer or other workpiece as a 150 mm (or 100 mm) wafer or other workpiece. This further reduces the scrap rate of a semiconductor device fabrication operation, thereby reducing the cost of such an operation.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 is a first perspective view crystal plane diagram showing the coordinate system for a hexagonal crystal such as 4H-silicon carbide ("SiC"), in which the c-plane (0001) is perpendicular to both the m-plane (1$\bar{1}$00) and the a-plane (11$\bar{2}$0). The c-plane is perpendicular to the <0001> direction. The m-plane (1$\bar{1}$00) is perpendicular to the <1$\bar{1}$00> direction. The a-plane (11$\bar{2}$0) is perpendicular to the <11$\bar{2}$0> direction. The <000$\bar{1}$> direction is opposite the <0001> direction.

Figure 2:
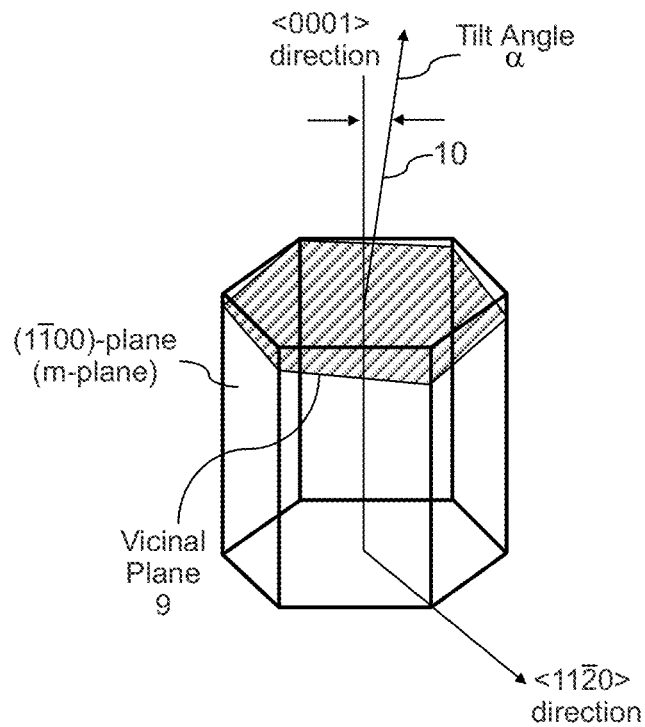
FIG. 2 is a second perspective view crystal plane diagram for a hexagonal crystal, illustrating a vicinal plane that is non-parallel to the c-plane.

FIG. 2 is a second perspective view crystal plane diagram for a hexagonal crystal, illustrating a vicinal plane 9 that is non-parallel to the c-plane, wherein a vector 10 (which is normal to the vicinal plane 9) is tilted away from the <0001> direction by a tilt angle α, with the tilt angle α being inclined (slightly) toward the <11$\bar{2}$0> direction.

Figure 3A:
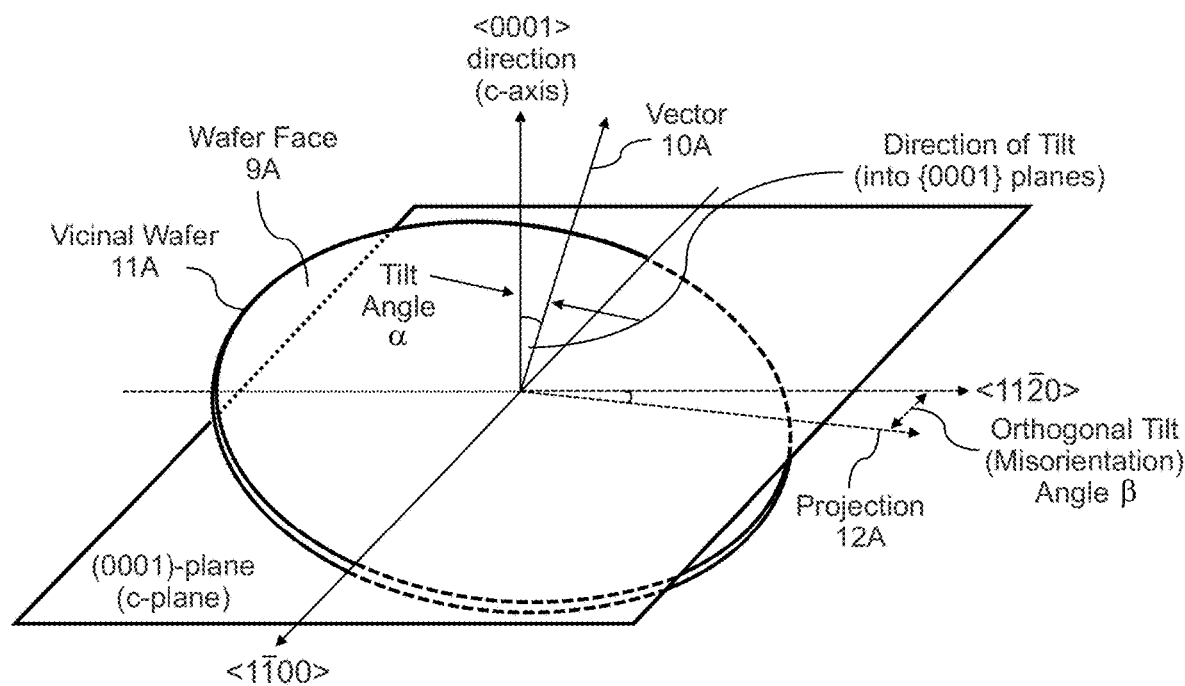
FIG. 3A is a perspective view wafer orientation diagram showing the orientation of a vicinal wafer relative to the c-plane.
Figure 3B:
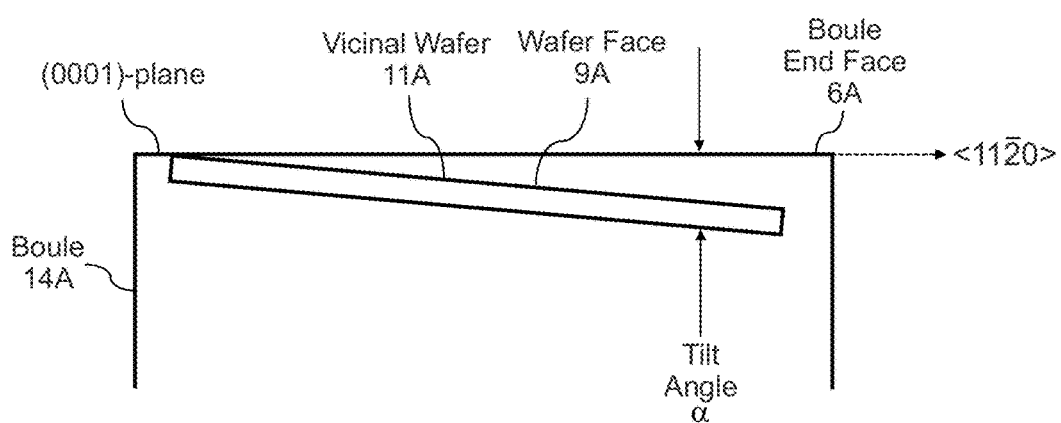
FIG. 3B is a simplified cross-sectional view of the vicinal wafer of FIG. 3A superimposed over a portion of a boule.

FIG. 3A is a perspective view of a wafer orientation diagram showing the orientation of a vicinal wafer 11A relative to the c-plane (0001), in which a vector 10A (which is normal to the wafer face 9A) is tilted away from the <0001> direction by a tilt angle α. An orthogonal tilt (or misorientation angle) β may span between the <11$\bar{2}$0> direction and the projection of vector 10A onto the c-plane. FIG. 3B is a simplified cross-sectional view of the vicinal wafer 11A superimposed over a portion of a boule 14A (e.g., an on-axis boule having an end face 6A parallel to the (0001) plane) from which the vicinal wafer 11A was defined. FIG. 3B shows that the wafer face 9A of the vicinal wafer 11A is misaligned relative to the (0001) plane by a tilt angle α.

Figure 3C:
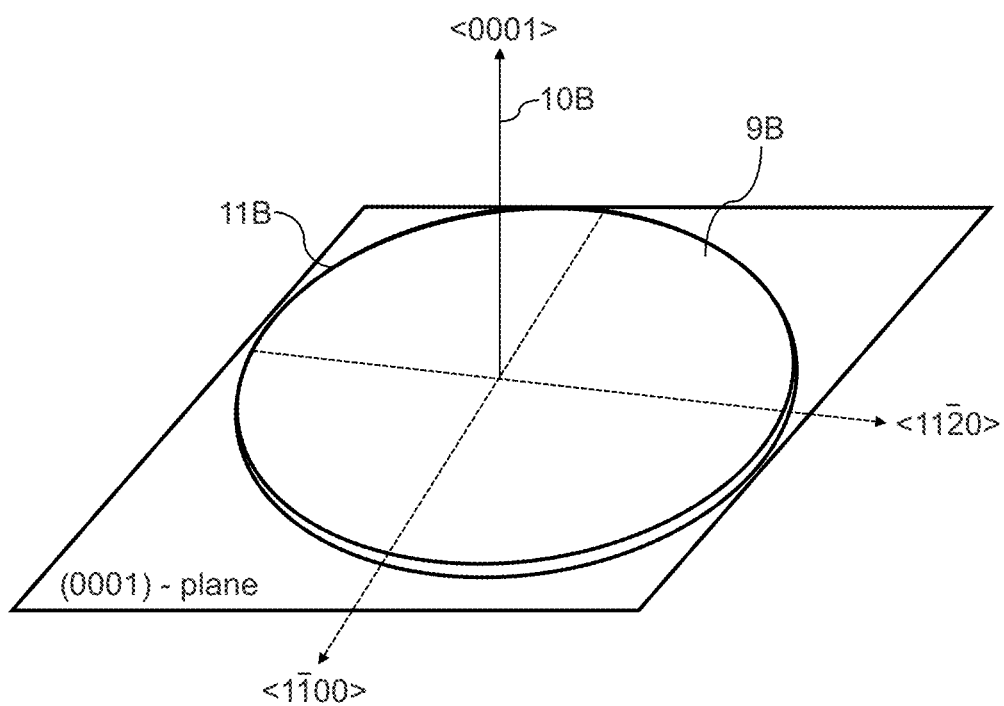
FIG. 3C is a perspective view of a wafer orientation diagram showing the orientation of an on-axis wafer relative to the c-plane.
Figure 3D:
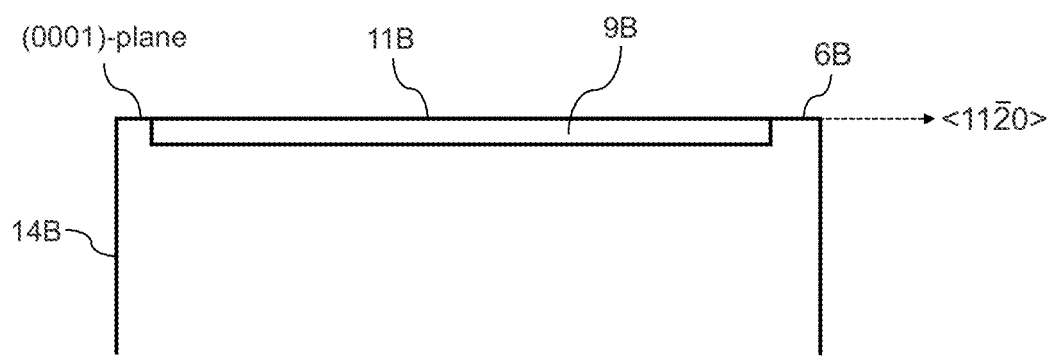
FIG. 3D is a simplified cross-sectional view of the wafer of FIG. 3C superimposed over a portion of a boule.

FIG. 3C is a perspective view of a wafer orientation diagram showing the orientation of an on-axis wafer 11B relative to the c-plane (0001), in which a vector 10B (which is normal to the wafer face 9B) is parallel to the <0001> direction. FIG. 3D is a simplified cross-sectional view of the wafer 11B superimposed over a portion of a boule 14B (e.g., an on-axis boule having an end face 6B parallel to the (0001) plane). FIG. 3D shows that the wafer face 9B of the on-axis wafer 11B is aligned with the (0001) plane.

Figure 4:
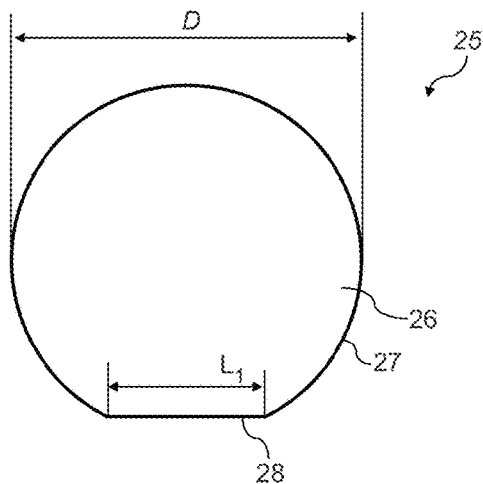
FIG. 4 is a top plan view of an example silicon carbide wafer, with superimposed arrows showing crystallographic orientation directions.

FIG. 4 is a top plan view of an example silicon carbide semiconductor wafer 25 including an upper face 26. The silicon carbide semiconductor wafer 25 may include a surface that is misaligned with (e.g., off-axis at an oblique angle relative to) the c-plane. The silicon carbide semiconductor wafer 25 may be laterally bounded by a generally round edge 27 (having a diameter D) including a primary flat 28 (having a length L1) that is perpendicular, for instance, to the (11$\bar{2}$0) plane. In some instances, the wafer 25 may include a notch instead of a primary flat.

Methods disclosed herein may be applied to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Example materials include, but are not limited to, silicon, gallium arsenide, and diamond.

In certain embodiments, such methods may utilize single crystal semiconductor materials having a hexagonal crystal structure, such as 4H-SiC, 6H-SiC, or Group III-nitride materials (e.g., GaN, AlN, InN, InGaN, AlGaN, or AlInGaN). Various illustrative embodiments described hereinafter mention SiC generally or 4H-SiC specifically, but it is to be appreciated that any suitable crystalline material may be used. Among the various SiC polytypes, the 4H-SiC polytype is particularly attractive for power electronic devices due to its high thermal conductivity, wide bandgap, and isotropic electron mobility. Bulk silicon carbide may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming n-doped or highly conductive material).

Certain embodiments herein may use substrates of doped or undoped silicon carbide, such as silicon carbide boules, which may be grown by physical vapor transport (PVT) or other conventional boule fabrication methods. If doped SiC is used, such doping may render the SiC n-type or semi-insulating in character. In certain embodiments, an n-type silicon carbide boule is intentionally doped with nitrogen. In certain embodiments, an n-type silicon carbide boule includes resistivity values within a range of 0.015 to 0.028 Ohm-centimeters. In certain embodiments, a silicon carbide boule may have resistivity values that vary with vertical position, such that different substrate portions (e.g., wafers) have different resistivity values, which may be due to variation in bulk doping levels during boule growth. In certain embodiments, a silicon carbide boule may have doping levels that vary horizontally, from a higher doping region proximate to a center of the boule to a lower doping level proximate to a lateral edge thereof.

Figure 5A:
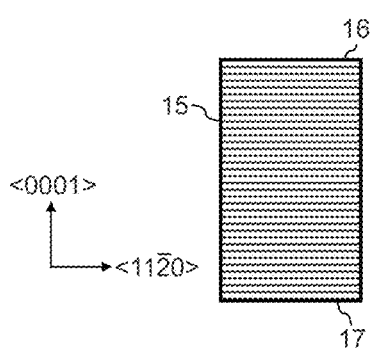
FIG. 5A is a side elevation schematic view of an on-axis boule of crystalline material.
Figure 5B:
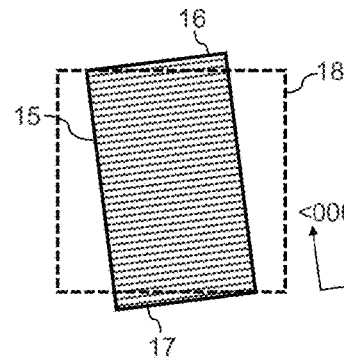
FIG. 5B is a side elevation schematic view of the boule of FIG. 5A rotated by 4 degrees, with a superimposed pattern for cutting end portions of the boule.
Figure 5C:
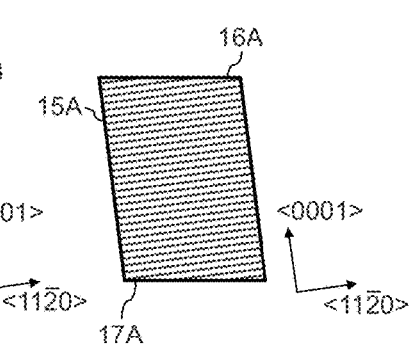
FIG. 5C is a side elevation schematic view of a boule following removal of end portions to provide end faces that are non-perpendicular to the c-direction.

FIGS. 5A and 5C schematically illustrate on-axis and off-axis crystalline substrates in the form of boules that may be utilized with methods disclosed herein. FIG. 5A is a side elevation schematic view of an on-axis boule 15 of crystalline material having first and second end faces 16, 17 that are perpendicular to the c-direction (i.e., <0001> direction for a hexagonal crystal structure material such as 4H-SiC). FIG. 5B is a side elevation schematic view of the boule 15 of FIG. 5A being rotated by four degrees, with a superimposed pattern 18 (shown in dashed lines) for cutting and removing end portions of the boule 15 proximate to the end faces 16, 17. FIG. 5C is a side elevation schematic view of an off-axis boule 15A formed from the boule 15 of FIG. 5B, following removal of end portions to provide new end faces 16A, 17A that are non-perpendicular to the c-direction. Aspects of the present disclosure are applicable to both on-axis boules 15 and/or off-axis boules 15A or other on-axis crystalline materials and/or off-axis crystalline materials.

Figure 5D:
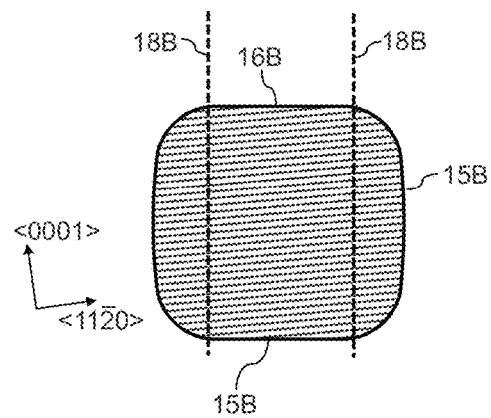
FIG. 5D is a side elevation schematic view of an off-axis grown boule of crystalline material.
Figure 5E:
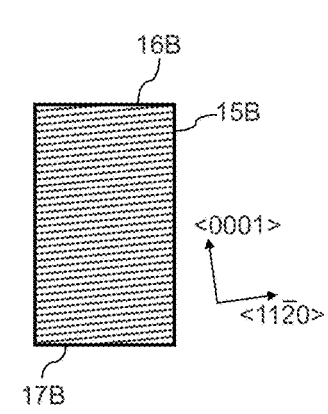
FIG. 5E is a side elevation schematic view of an off-axis grown boule having end faces that are non-perpendicular to the c-direction.

FIGS. 5D and 5E schematically illustrate off-axis grown boules that may be utilized with methods disclosed herein. FIG. 5D is a side elevation schematic view of an off-axis grown boule 15B of crystalline material (e.g., grown from an off-axis seed material) having first and second end faces 16B and 17B that are non-perpendicular to the c-direction (e.g., <0001> direction for a hexagonal crystal structure material such as 4H-SiC). Portions of the boule 15B may be cut along the superimposed pattern 18B (shown in dashed lines) to provide the off-axis boule 15B shown in FIG. 5E. Off-axis semiconductor wafers may be provided from the off-axis boule 15E by cutting or otherwise removing the wafers from the boule 15B in a manner parallel to the faces 16B, 17B.

Aspects of the present disclosure are directed to providing semiconductor wafers from any suitable boule, such as an on-axis boule, an off-axis boule, an on-axis grown boule, and off-axis grown boule, a boule grown along other directions or axes (e.g., a-axis, c-axis) or other suitable boule.

Figure 6:
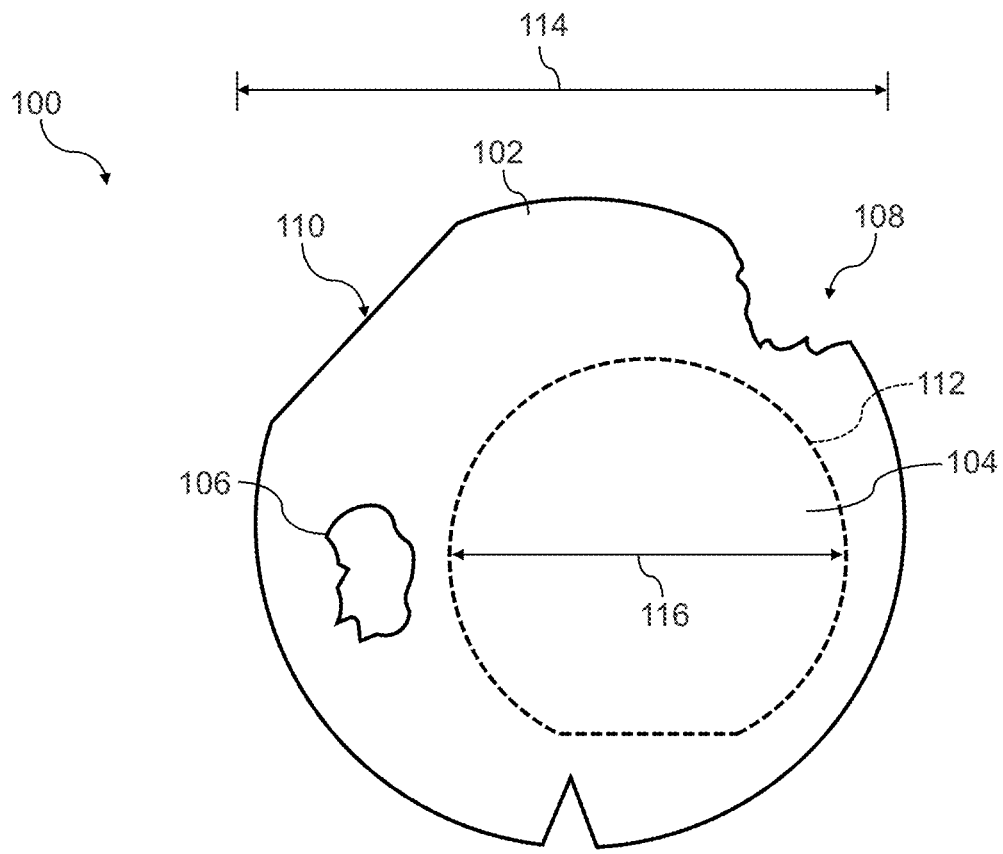
FIG. 6 depicts a top-down representation of an example first semiconductor wafer according to examples of the present disclosure.

FIG. 6 depicts a top-down representation of an example first semiconductor workpiece 100 according to examples of the present disclosure. As shown, the first semiconductor workpiece 100 includes a first portion 102 and a second portion 104. The first portion 102, in turn, may contain one or more defects that may render the first portion 102 unsuitable or undesirable for further processing to fabricate power semiconductor devices. Specifically, in the illustrated embodiment, the first portion 102 includes a crystal growth defect 106, an edge chip defect 108, and an over-edge grind defect 110. However, in other examples, the first portion 102 may include any number and/or type of defects. Conversely, the second portion 104 may generally be free of defects and suitable or desirable for further processing to fabricate semiconductor devices. In this respect, and as will be described below, a laser-based coring operation is performed on the first semiconductor workpiece 100 to remove the first portion 102 of the first semiconductor workpiece 100 from the second portion 104. Thereafter, the first portion 102 can be scrapped and the second portion 104 can be further processed to fabricate semiconductor devices.

Additionally, as shown, the second portion 104 has a shape corresponding to a second semiconductor workpiece 112 of a different diameter relative to the first semiconductor workpiece 100. That is, the first semiconductor workpiece 102 has a first diameter 116 and the second semiconductor workpiece 112 has a second diameter 116, which is smaller than the first diameter 114. For instance, in one example, the first semiconductor workpiece 100 may have a first diameter 114 of about 200 mm and the second semiconductor workpiece 112 may have a second diameter 116 of about 150 mm. In another example, the first semiconductor workpiece 100 may have a first diameter 114 of about 200 mm and the second semiconductor workpiece 112 may have a second diameter 116 of about 100 mm. In a further example, the first semiconductor workpiece 100 may have a first diameter 114 of about 150 mm and the second semiconductor workpiece 112 may have a second diameter 116 of about 100 mm. However, in other examples, the first semiconductor workpiece 100 may have any suitable first diameter and the second semiconductor workpiece 112 may have any suitable second diameter that is smaller than the first diameter. As illustrated in FIG. 6, the second semiconductor workpiece 112 may have a flat (or a notch) associated with crystal orientation of the second semiconductor workpiece 112.

The first semiconductor workpiece 100 may be any suitable type of workpiece. For instance, in some examples, the first semiconductor workpiece 100 may be a semiconductor wafer, such as a finished wafer or an unfinished wafer. In other examples, the first semiconductor workpiece 100 may be a semiconductor boule.

Figure 7:
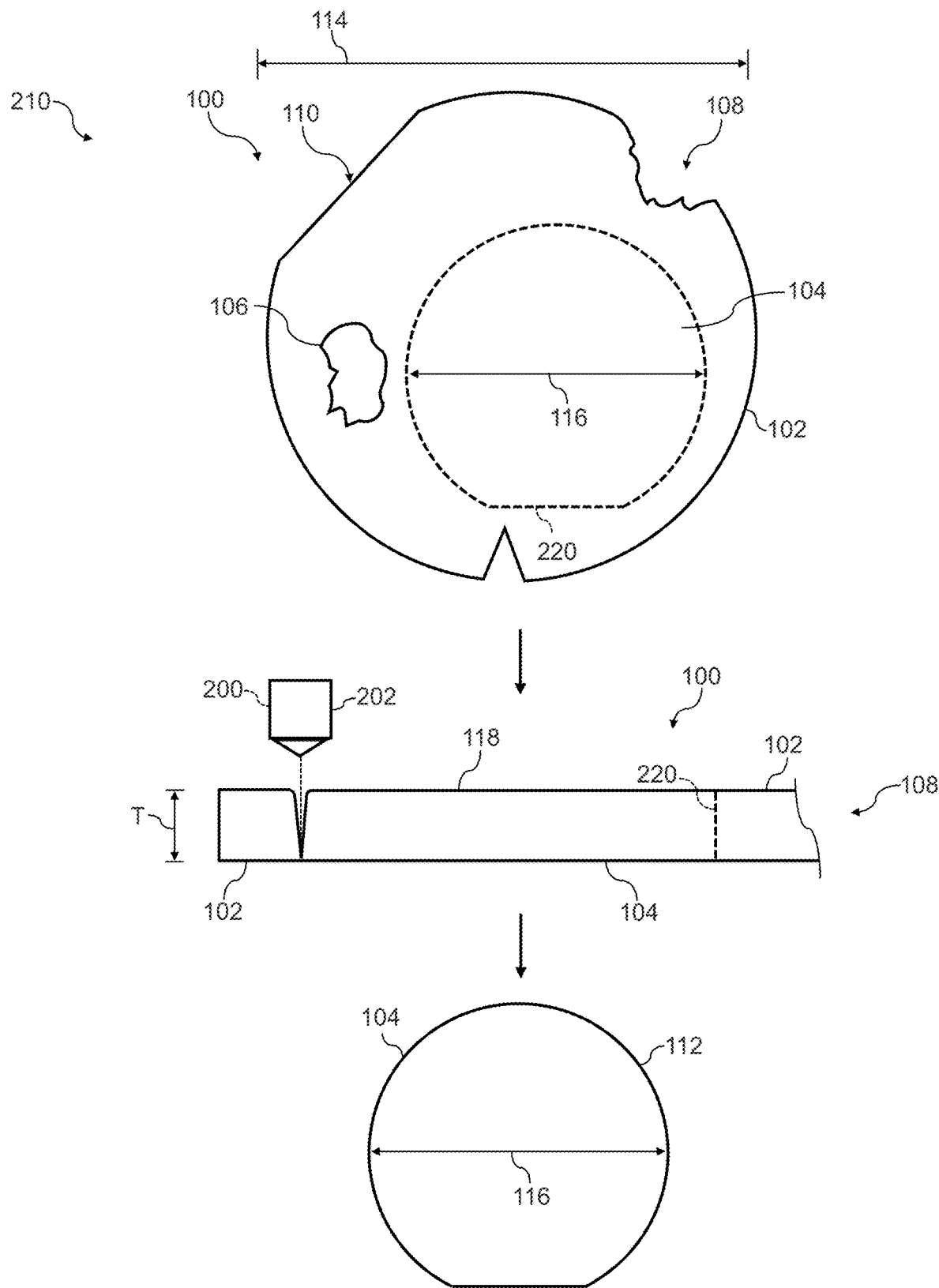
FIG. 7 depicts example emission of one or more lasers through a thickness of a first semiconductor wafer according to examples of the present disclosure.

FIG. 7 depicts example laser coring of the first semiconductor workpiece 100 according to examples of the present disclosure. FIG. 7 is illustrated with respect to coring or otherwise separating the second portion 104 of the first semiconductor workpiece 100 from the first portion 102 of the first semiconductor workpiece 100 the surface 122 of the semiconductor workpiece 120 using one or more lasers for purposes of illustration and discussion. Those of ordinary skill in the art, using the disclosures provided herein, will understand that such laser-based coring may be implemented on any other suitable semiconductor workpiece without deviating from the scope of the present disclosure.

As shown in FIG. 7, a laser coring process 210 may be implemented on the first semiconductor workpiece 100 using a laser apparatus 200. The laser apparatus 200 is configured to provide emission of one or more lasers 202 through a thickness T of the first semiconductor workpiece 100. As used herein, providing emission of a laser refers to both providing continuous emission and/or providing modulated emission (e.g., a plurality of laser pulses). The laser apparatus 200 may include a laser source and one or more lenses, mirrors, or other optics to focus the laser 202 at a particular focal depth on or below a top or exposed surface 118 of the first semiconductor workpiece 100. The laser apparatus 200 may emit the laser with sufficient power, pulsing frequency, and pulse duration to remove semiconductor material (e.g., silicon carbide) from the first semiconductor workpiece 100. In this respect, by ablating or otherwise removing semiconductor material of the first semiconductor workpiece 100 separating the first portion 102 and the second portion 104 with the one or more lasers 202, the first portion 102 can be removed from the second portion 104, thereby forming the second semiconductor workpiece 112. For example, in some embodiments, the one or more lasers 202 may ablate or remove semiconductor material along a cut line 220 separating the first portion 102 and the second portion 104.

In some examples, the laser apparatus 200 may be operated in accordance with the following laser parameters to implement the laser coring process 210:

Laser wavelength: about 500 nanometers to about 1100 nanometers, such as about 532 nanometers, such as about 1064 nanometers, such as about 1080 nanometers; or multiple wavelengths (e.g., white light) including any of the foregoing;

Laser Pulse Frequency: about 1 kilohertz to about 200 kilohertz, such as about 10 kilohertz to about 150 kilohertz, such as about 20 kilohertz to about 100 kilohertz;

Laser power: 0.1 watts to about 500 watts, such as about 0.5 watts to about 100 watts, such as about 1 watt to about 40 watts, such as about 1 watt to about 10 watts;

Laser pulse duration: about 0.1 femtoseconds to about 300 nanoseconds; such as about 1 femtosecond to about 150 nanoseconds, such as about 1 femtosecond to about 100 nanoseconds;

Translation speed: about 0 millimeters per second to about 2 meters per second, such as about 1 millimeter per second to about 1 meter per second;

Focusing depth: about 0 microns to about 1500 microns (beneath the surface of the workpiece), such as about 0 microns to about 1000 microns (beneath the surface of the workpiece), such as about 1 micron to about 100 microns (beneath the surface of the workpiece); and Laser Pulse Energy: about 1 nanojoule to about 2 joules, such as about 10 nanojoules to about 200 millijoules.

In some examples, the laser coring process 210 may be performed in multiple passes of the laser at a fixed focal depth until sufficient semiconductor material is ablated or otherwise removed from the first semiconductor workpiece 100 such that the first portion 102 can be separated from the second portion 104. For instance, multiple passes of the laser 202 at a fixed focal depth at about 1 micron below the top surface 118 may be performed until the laser 202 can penetrate through the thickness T of the first semiconductor wafer 100.

Figure 8:
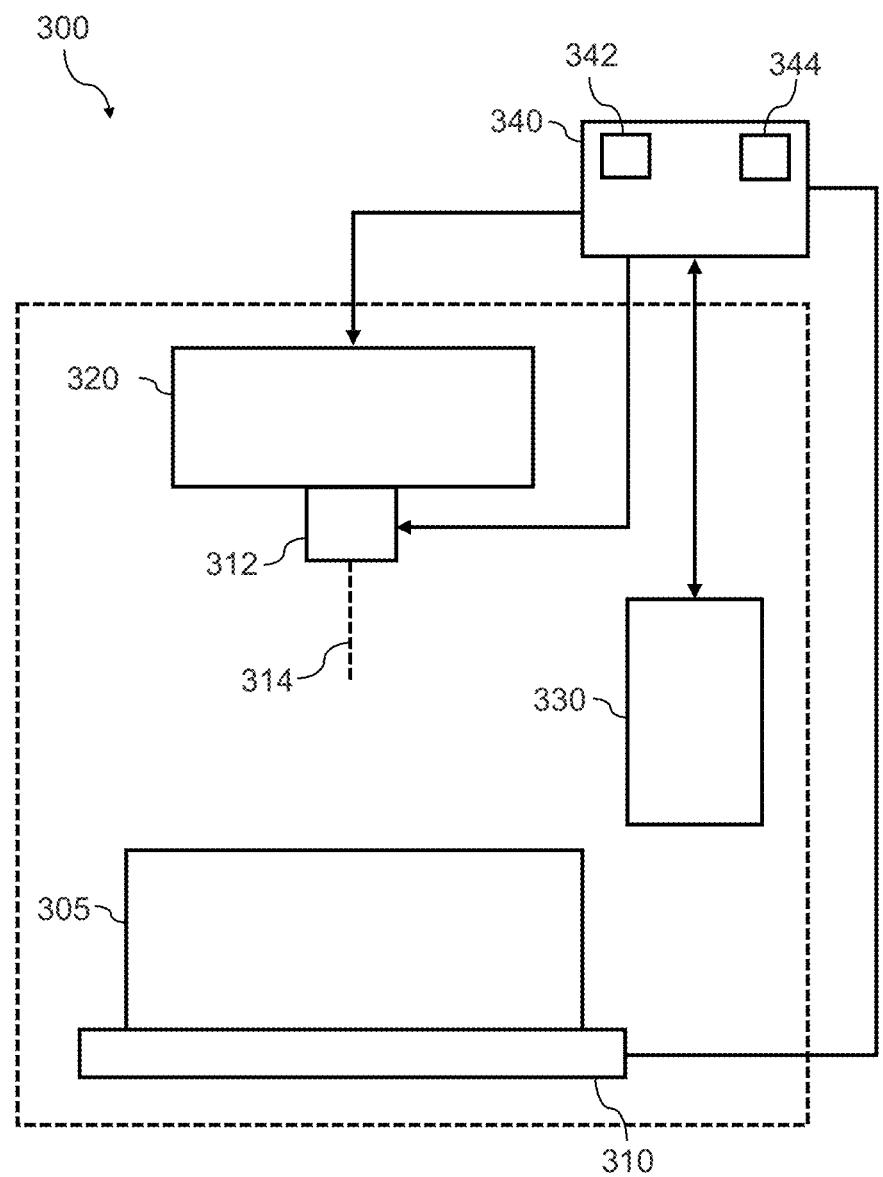
FIG. 8 depicts an example laser processing system according to examples of the present disclosure.

FIG. 8 depicts an example laser processing system 300 according to examples of the present disclosure. The laser processing system 300 may be configured to implement one or more aspects of the present disclosure, such as the laser-based coring processes disclosed herein.

The laser processing system 300 includes one or more laser sources 312. The one or more laser sources 312 may be configured to emit one or more lasers 314 in accordance with various laser parameters. The laser parameters may include, for instance, focusing depth, laser power, laser wavelength, laser pulse duration, laser pulse frequency, laser pulse energy, etc. For example, the one or more laser sources 312 may be operable to emit a laser(s) 314 with laser parameters sufficient to perform a laser coring process.

The one or more laser sources 312 may be associated with one or more wavelengths and may be, for instance, one or more of an excimer laser, UV laser, visible light laser, infrared laser, single wavelength laser, multiwavelength laser, white laser, etc. The one or more laser sources 312 may each be associated with a pulse duration and may be, one or more of an attosecond laser, femtosecond laser, nanosecond laser, etc. The one or more laser sources 312 may each be associated with a lasing medium and may be, for instance, a gas (e.g., $CO_2$) laser, solid state laser (e.g., GaN, AlGaN, YAG, etc.), diode laser, fiber laser, etc. The one or more laser sources 312 may be one or more of a single frequency laser, frequency-doubled laser, frequency tripled laser, frequency quadrupled laser, etc.

In embodiments including a plurality of laser sources 312, such laser sources 312 may each be the same type of laser source or different types of laser sources. The laser sources 312 may be configured to emit lasers 314 in accordance with the same laser parameters or different laser parameters.

The system 300 may include one or more additional laser sources to provide different functionality. In some examples, the system 300 may include one or more laser sources operable to scribe a fiducial workpiece mark or ID mark on the semiconductor wafer. In some examples, the system 300 may include one or more laser sources configured to obtain metrology (e.g., surface topography measurements) of a semiconductor workpiece 305.

The system 300 includes a workpiece support 310 configured to support a semiconductor workpiece 305 (e.g. the first semiconductor workpiece 100). The workpiece support 310 may include a chuck (e.g., vacuum chuck) or other mechanism to hold the semiconductor workpiece 305 in place during laser coring according to examples of the present disclosure.

The one or more laser sources 312 may be coupled to a translation stage 320 that may move the one or more laser sources 312 relative to the semiconductor workpiece. In addition, the one or more laser sources 312 and/or the translation stage 320 may include one or more optics (e.g., lens, mirrors, etc.) to facilitate moving the laser(s) 314 emitted by the one or more laser sources 312 relative to the semiconductor workpiece 305. In addition, or in the alternative, the workpiece support 310 may be operable to move the semiconductor workpiece 305 relative to the one or more laser sources 312. In this way, the system 300 may be able to control the translation stage 320 and/or the workpiece support 310 to impart relative motion (e.g., translation and/or rotation) between the laser(s) 314 and the semiconductor workpiece 305 to implement laser-based coring processes according to examples of the present disclosure.

In some embodiments, the laser processing system 300 may additionally include one or more sensors 330 for obtaining data associated with the semiconductor workpiece 305, such as workpiece property data for the semiconductor workpiece 305. The workpiece property data may include, for instance, data associated with a surface of the semiconductor workpiece 305 (e.g., topography, roughness), subsurface regions of the semiconductor workpiece 305, optical properties of the semiconductor workpiece 305, temperature of the semiconductor workpiece 305, doping level of the semiconductor workpiece 305, polytype of the semiconductor workpiece 305 (e.g., 4H, 6H), or other parameters.

In some embodiments, the one or more sensors 330 may include, for instance, an optical sensor, such as an image capture device (e.g., camera) that may capture images at one or more wavelengths of visible light and/or ultraviolet or infrared light. In some embodiments, the one or more sensors 330 may include one or more surface measurement lasers that may be operable to emit a laser onto the surface of the semiconductor workpiece 305 and scan the surface (based on reflections of the laser) for depth measurements, topography measurements, etc. of the surface of the semiconductor workpiece 305. Other suitable sensors 330 may be used without deviating from the scope of the present disclosure.

The laser processing system 300 includes one or more control devices, such as a controller 340. The controller 340 may include one or more processors 342 and one or more memory devices 344. The one or more memory devices 344 may store computer-readable instructions that when executed by the one or more processors 342 cause the one or more processors 342 to perform one or more control functions, such as any of the functions described herein. The controller 340 may be in communication with various other aspects of the laser processing system 300 through one or more wired and/or wireless control links. The controller 340 may send control signals to the various components of the laser processing system 300 (e.g., the one or more laser sources 312, the workpiece support 310, the sensor 330) to implement a laser coring operation on the semiconductor workpiece 305.

In some embodiments, the controller 340 may control aspects of the laser processing system 300 (e.g., the one or more laser sources 312) based at least in part on data from the sensor(s) 330. For instance, the controller 340 may adjust various laser parameters for the laser(s) 314 emitted by the one or more laser sources 312 based at least in part on data from the sensor(s) 330. The laser parameters may include, for instance, one or more of focusing depth, laser power, laser wavelength, laser pulse duration, laser pulse frequency, laser pulse energy, scan pattern, and/or translation speed. In some embodiments, the laser parameters may include the incidence angle of the laser(s) 314 on the semiconductor workpiece 305. The controller 340 may be configured to adjust the laser parameters based on sensor data associated with a current semiconductor workpiece 305 undergoing a laser-based coring operation (e.g., dynamic adjustment during or after a laser-based coring operation) or based on sensor data associated with past semiconductor workpieces that had previously undergone a laser-based coring operation. In some embodiments, the laser sources 312 may include an adaptive optics system that may include one or more lenses, mirrors, or other optical devices. The lenses, mirrors, or other optical devices may be moved or adjusted to adjust one or more of the one or more laser parameters. For instance, the one or more lenses may be swapped or adjusted to change a focal depth of the lasers 314.

Figure 9:
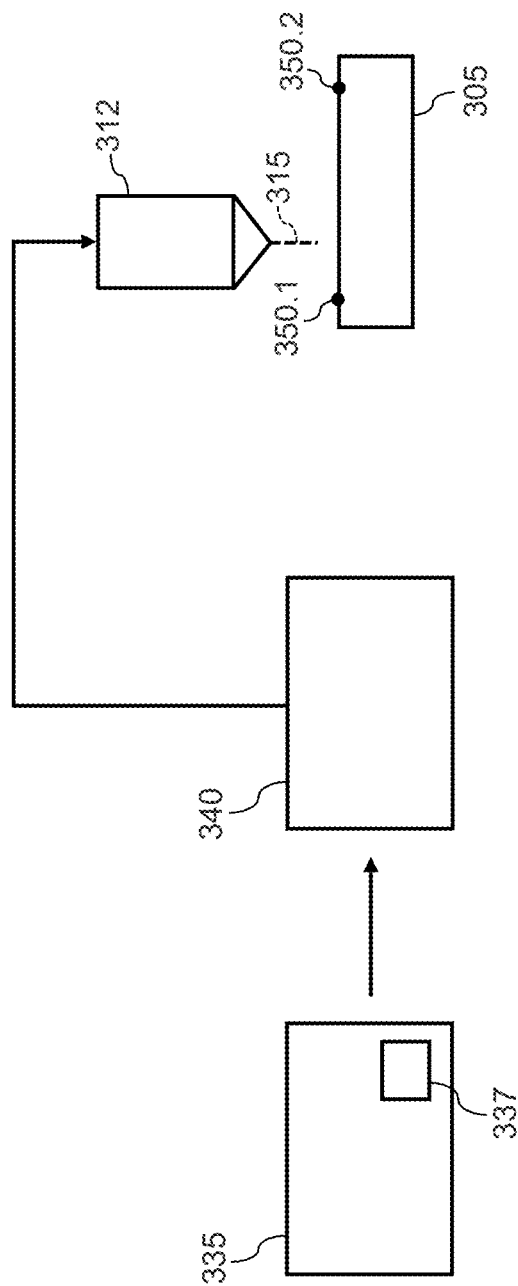
FIG. 9 depicts example control of a laser based on sensor data according to examples of the present disclosure.

FIG. 9 depicts an overview of example control of a laser source 312 based at least in part on sensor data 335 from the one or more sensors 330 or other data (e.g., from metrology tools) according to examples of the present disclosure. As shown, the sensor data 335 may be provided to the controller 340 (e.g., through a communication link). The sensor data 335 may include, for instance, workpiece property data 337. Workpiece property data 337 may include data associated with a surface of the semiconductor workpiece 305 (e.g., topography, roughness, presence of defects, etc.), subsurface regions of the semiconductor workpiece 305, optical properties of the semiconductor workpiece 305, temperature of the semiconductor workpiece 305, doping level of the semiconductor workpiece 305, polytype of the semiconductor workpiece 305 (e.g., 4H, 6H), or other parameters. In some examples, the workpiece property data 337 may include data associated with a surface topography of the semiconductor workpiece 305. In some examples, the workpiece property data 337 may include an image of a surface of the semiconductor workpiece 305 obtained using an optical sensor or image capture device. In some examples, a scan of the surface may be obtained using one or more surface measurement lasers or other optical devices. In some examples, an image may be captured of the surface and analyzed using computer image processing techniques (e.g., classifier models, such as machine-learned classifier models) to determine data indicative of workpiece properties, such as the presence of anomalies, defects, roughness, topography, optical properties, etc. The controller 340 may determine one or more laser parameters for the laser 315 emitted by the laser source 312 on the semiconductor workpiece 305 based on the sensor data 335 or other data. For instance, in some embodiments, the controller 340 may access a model, algorithm, function, lookup table, machine-learned model, etc., that correlates one or more laser parameters based on the data and/or position on the semiconductor workpiece 305.

In some embodiments, the one or more laser parameters are specified as a function of both a position on the semiconductor workpiece 305 and sensor data 335 or other data associated with that specific position. For instance, the controller 340 may determine a first set of laser parameters for the laser 315 for ablating or removing material at a first position 350.1 on the semiconductor workpiece 305. The controller 340 may determine a second set of laser parameters for the laser 315 for ablating or removing material at a second position 350.2 on the semiconductor workpiece 305. The first set of laser parameters may be different from or the same as the second set of laser parameters.

In this way, the laser parameters may be continuously or periodically adjusted or tuned to perform ablation and/or materials removal based on one or more workpiece properties at a specific position on the semiconductor workpiece 305. In some embodiments, this may provide, for instance, higher laser power for a first position 350.1 on the semiconductor workpiece 305 relative to a second position 350.2 on the semiconductor workpiece 305. In some embodiments, this may provide, for instance, a first incidence angle of the laser 315 relative to the semiconductor workpiece 305 at a first position 350.1 on the semiconductor workpiece 305 and a second incidence angle of the laser 315 relative to the semiconductor workpiece 305 at a second position 350.2 on the semiconductor workpiece 305. In some embodiments, this may provide, for instance, use of a first laser source 312 operable to emit a laser 315 associated with a first wavelength (e.g., infrared wavelength) at a first position 350.1 on the semiconductor wafer and use of a second laser source 312 operable to emit a laser 315 associated with a second wavelength (e.g., ultraviolet wavelength) at a second position 350.2 on the semiconductor workpiece. A variety of laser parameters (e.g., focusing depth, laser power, laser wavelength, laser pulse duration, laser pulse frequency, translation speed, incidence angle, laser pulse energy) may be adjusted as a function of position on the semiconductor workpiece and/or sensor data or other data without deviating from the scope of the present disclosure.

In some examples, the laser source 312 may be dynamically adjusted, or tuned, during a laser-based coring operation. For instance, the one or more sensors 330 or other data sources may provide sensor data 335 or other data to the controller 340 and the controller 340 may determine, or adjust, one or more laser parameters for the laser 315 based on the data while performing the laser-based coring operation. For instance, the one or more sensors 330 may provide data indicative of a surface topography of the semiconductor workpiece 305 to the controller 340 while the laser 315 is processing the surface of the semiconductor workpiece 305. The controller 340 may then adjust one or more laser parameters of the laser 315 based on the data while the laser 315 is still processing the surface of the semiconductor workpiece 305. In this way, the one or more laser parameters may be dynamically adjusted, or tuned, during laser coring operations.

In some examples, the one or more laser parameters may be adaptively tuned for future laser-based surface processing operations and/or future additional wafer(s). For instance, the controller 340 may determine one or more laser parameter adjustments based on one or more laser-based coring operations on a first semiconductor workpiece 305 and apply the adjustments to one or more laser parameters for a laser-based coring operation on another semiconductor workpiece 305.

Figure 10:
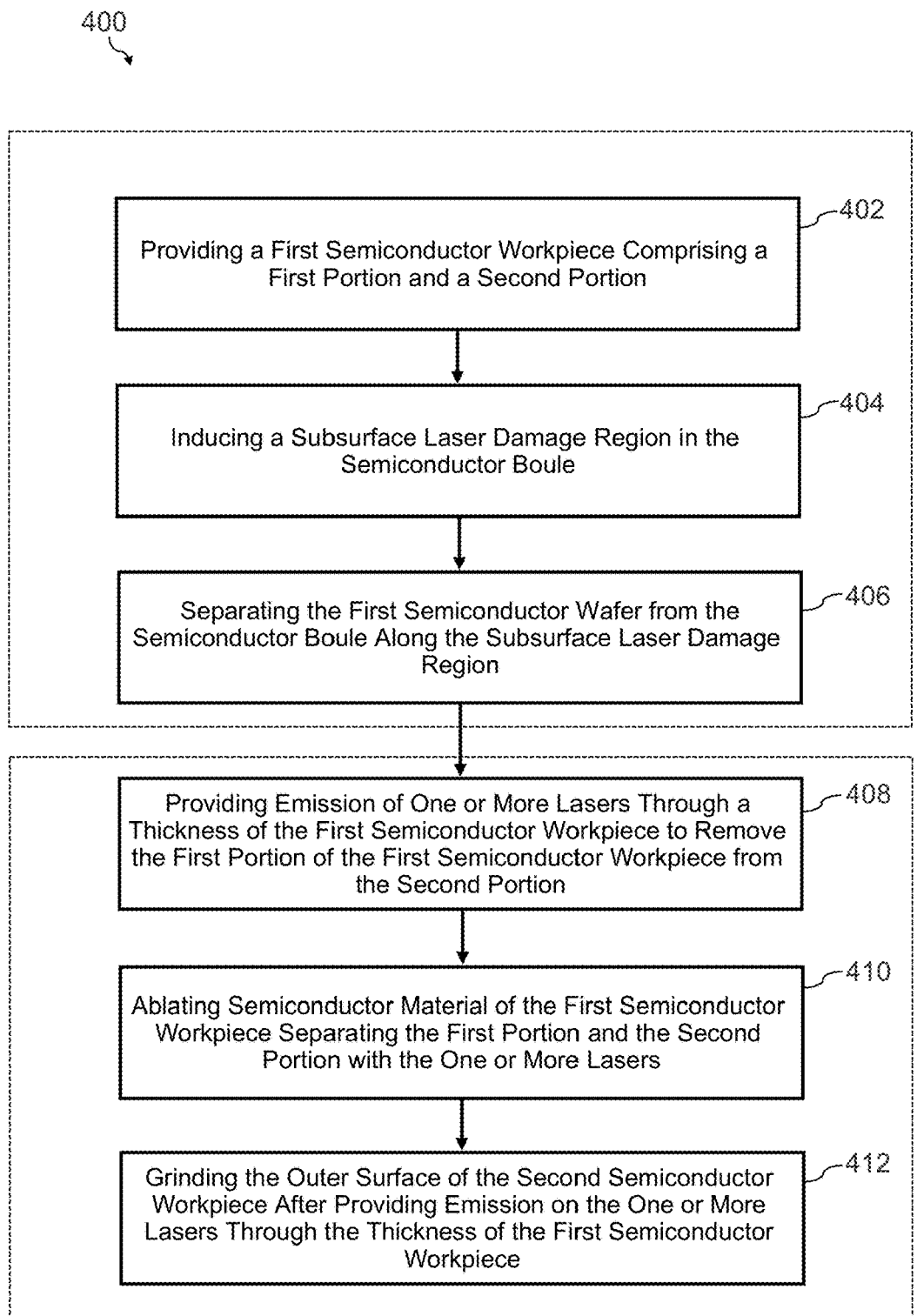
FIG. 10 depicts a flow chart diagram of an example method according to examples of the present disclosure.

FIG. 10 depicts a flow chart diagram of an example method 400 according to example aspects of the present disclosure. The method 400 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 402, the method 400 includes providing a first semiconductor workpiece including a first portion and a second portion. The first portion of the first semiconductor workpiece may contain one or more defects. For example, the first portion may include one or more crystal growth defects, edge chip defects, over-edge grind defects, etc. Conversely, the second portion of the first semiconductor workpiece may generally be free of defects and is, thus, suitable for further processing to fabricate power semiconductor devices. In some examples, the first semiconductor workpiece is a wide bandgap semiconductor workpiece, such as a silicon carbide or Group-III nitride semiconductor wafer. In some examples, the first semiconductor workpiece is a semiconductor wafer. For instance, in some examples, the semiconductor wafer may be removed from a semiconductor boule using a removal process. Additionally, the first semiconductor wafer may be an unfinished wafer or a finished wafer. In other examples, the first semiconductor workpiece is a semiconductor boule.

As shown in FIG. 10, the removal process may include, for example, at 404, inducing a subsurface laser damage region in the boule. In some instances, the subsurface laser damage may be induced in the boule using one or more lasers. The removal process may additionally include, for example, at 406 separating the first semiconductor wafer from the boule along the subsurface laser damage region. Other suitable removal processes may be used without deviating from the scope of present disclosure, such as removal using one or more wire saws.

At 408, the method 400 includes providing emission of one or more lasers through a thickness of the first semiconductor workpiece to remove the first portion of the first semiconductor workpiece from the second portion. As such, the second portion has a shape corresponding to a second semiconductor workpiece of a different diameter relative to the first semiconductor workpiece. That is, the second semiconductor workpiece has a smaller diameter than the first semiconductor workpiece. For instance, in one example, the first semiconductor workpiece may have a first diameter of about 200 mm and the second semiconductor workpiece may have a second diameter of about 150 mm. In another example, the first semiconductor workpiece may have a first diameter of about 200 mm and the second semiconductor workpiece may have a second diameter of about 100 mm. In a further example, the first semiconductor workpiece may have a first diameter of about 150 mm and the second semiconductor workpiece may have a second diameter of about 100 mm. However, in other examples, the first semiconductor workpiece 100 may have any suitable first diameter and the second semiconductor workpiece may have any suitable second diameter that is smaller than the first diameter.

At 410, providing emission of the one or more lasers through the thickness of the first semiconductor workpiece may include ablating semiconductor material of the first semiconductor workpiece separating the first portion and the second portion with the one or more lasers. In this regard, by ablating the semiconductor material separating the first portion and the second portion with the one or more lasers (i.e., coring the first semiconductor wafer), the first portion of the first semiconductor workpiece can be removed or otherwise separated from the second portion, thereby forming the second semiconductor workpiece.

At 412, the method 400 may include grinding the outer surface of the second semiconductor workpiece after providing emission of the one or more lasers through the thickness of the first semiconductor workpiece. More specifically, an outer surface of the second semiconductor workpiece formed from the laser-based coring operation may have a flared edge such that a bottom portion of the outer surface is wider than a top portion of the outer surface. In this respect, a grinding operation may be performed on the outer surface of the second semiconductor workpiece to remove the flared edge. Thus, the grinding operation reduces a diameter of the second semiconductor workpiece to a finished workpiece diameter.

Figure 11:
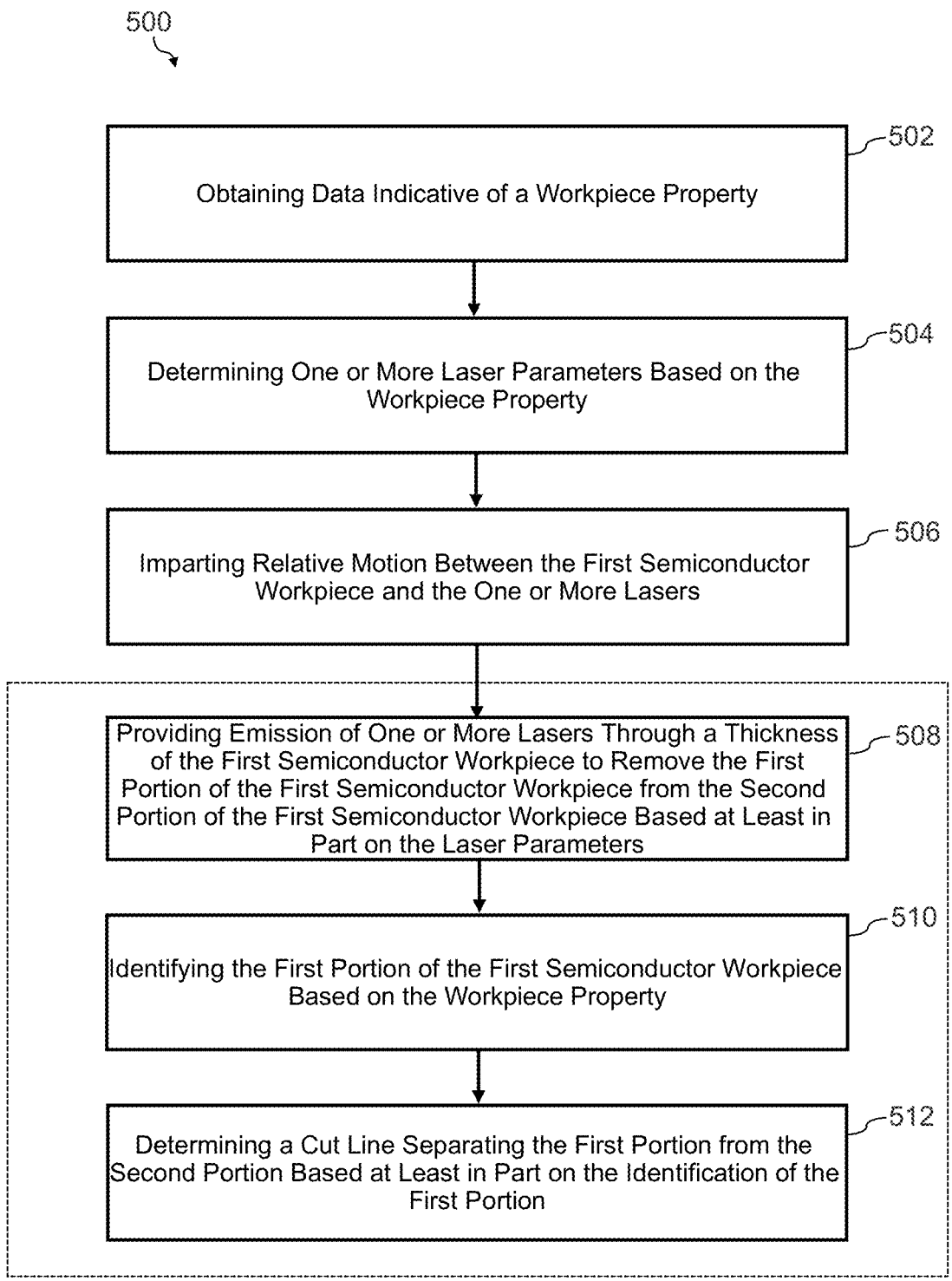
FIG. 11 depicts a flow chart diagram of an example method according to examples of the present disclosure.

FIG. 11 depicts a flow chart diagram of an example method 500 according to aspects of the present disclosure. The method 500 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure. The method 500 may be implemented, for example, as part of the laser coring process described at 408 in the method 400 of FIG. 10.

At 502, the method 500 includes obtaining workpiece property data associated with the first semiconductor workpiece. For instance, the workpiece property data may be obtained from one or more sensors. In some embodiments, the workpiece property data may be obtained by scanning a surface of the first semiconductor workpiece with one or more surface measurement lasers. In some embodiments, the workpiece property data may be obtained from an optical sensor or image-capturing device (e.g., camera) and processing or analyzing the images (e.g., using digital image process techniques) obtained from the optical sensor or image-capturing device. The workpiece property data may be obtained in a variety of formats without deviating from the scope of the present disclosure.

At 504, the method 500 includes determining one or more laser parameters based on the workpiece property data. For instance, the method may include determining one or more of laser power, laser wavelength, laser pulse frequency, laser pulse duration, focusing depth, laser pulse energy, translation speed, laser scan pattern, or laser incidence angle based on the workpiece property data. In some embodiments, the one or more laser parameters may be determined as a function of position on the surface of the first semiconductor workpiece.

At 506, the method 500 includes imparting relative motion between the first semiconductor workpiece and the one or more lasers. In some instances, imparting relative motion may be performed during other operations of the method 500. For example, imparting relative motion between the first semiconductor workpiece and the one or more lasers may be performed during the operation 508 described below. As an example, imparting relative motion between the one or more lasers and the first semiconductor workpiece may result in a cut line separating the first portion of the first semiconductor workpiece from the second portion being scanned by the one or more lasers. In some instances, imparting relative motion between the first semiconductor workpiece and the one or more lasers may include moving (e.g., translating and/or rotating) the first semiconductor workpiece relative to the one or more lasers. The inverse may also be true. In some instances, the one or more lasers may be moved relative to the first semiconductor workpiece.

At 508, the method 500 includes providing emission of one or more lasers through a thickness of the first semiconductor workpiece to remove a first portion of the first semiconductor workpiece from a second portion of the first semiconductor workpiece based at least in part on the laser parameters as described in the present disclosure.

At 510, providing emission of one or more lasers through the thickness of the first semiconductor workpiece includes identifying the first portion of the first semiconductor workpiece based on the workpiece property obtained at 502. In some embodiments, the first portion may be identified based on the workpiece property data. For instance, in some examples, the sizes and/or locations of defects or other anomalies present in the first semiconductor workpiece may be used to identify the first portion. In some examples, other data or parameters, such as the size of the first semiconductor workpiece and the desired size of the second semiconductor workpiece, may also be used to identify the first portion.

At 512, providing emission of one or more lasers through the thickness of the first semiconductor workpiece includes determining a cut line separating the first portion from the second portion based at least in part on the identification of the first portion. In some embodiments, after the first portion is identified, a cut line separating the first portion from the second portion may be determined based at least in part on the identification of the first portion at 510. Thereafter, the cut line may be used to guide the relative movement between the one or more lasers and the first semiconductor workpiece such that semiconductor material present along the cut line is ablated. Such ablation, in turn, separates the first portion of the first semiconductor wafer from the second portion, thereby forming the second semiconductor workpiece. In this respect, the second semiconductor workpiece may be further processed to fabricate power semiconductor devices. Conversely, the first portion of the first semiconductor workpiece may be scrapped.

Figure 12:
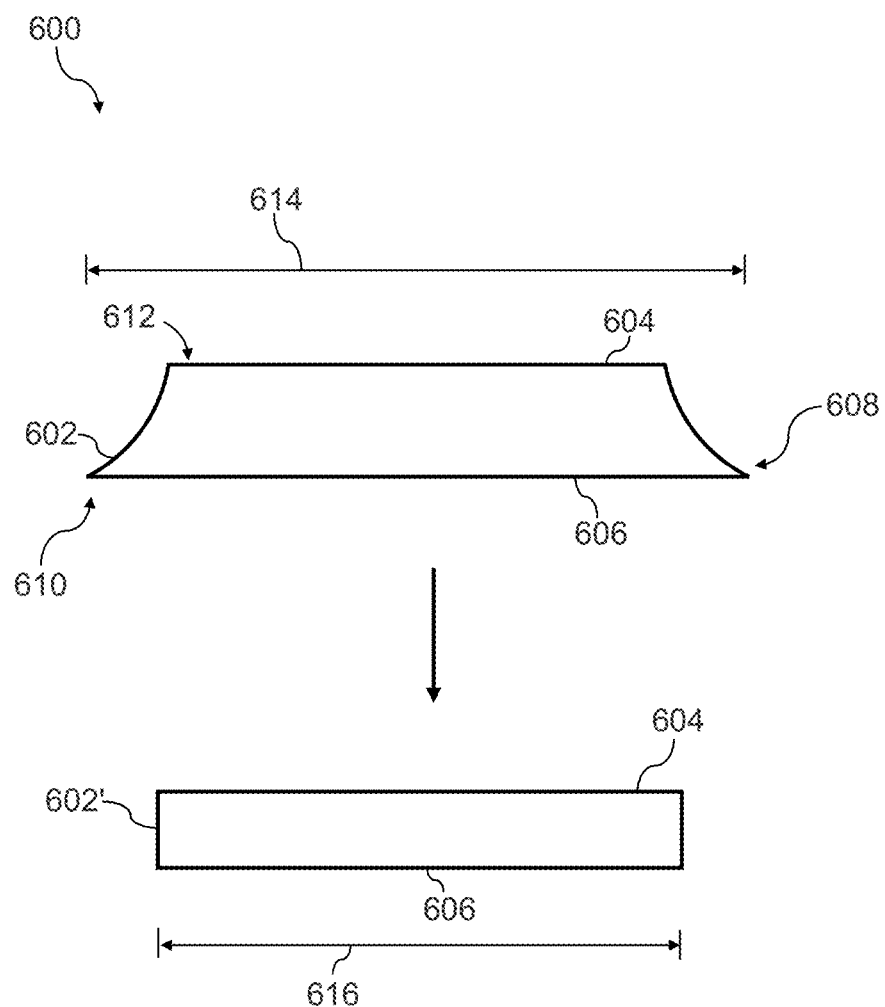
FIG. 12 depicts a semiconductor wafer according to examples of the present disclosure.

FIG. 12 depicts an example cored semiconductor wafer 600 that has been subjected to a laser-based coring operation according to examples of the present disclosure. The cored semiconductor wafer 600 may include silicon carbide. In some examples, the cored semiconductor wafer 600 may include, for instance, 4H silicon carbide or 6H silicon carbide. The semiconductor wafer 600 may include one or more doped regions. In some examples, the semiconductor wafer 600 may be undoped or only unintentionally doped.

The cored semiconductor wafer 600 may have any suitable diameter that is less than the diameter of the semiconductor wafer from which it was cored. For instance, in some examples, the cored semiconductor wafer 600 may have a diameter of about 150 mm. In other examples, the cored semiconductor wafer 600 may have a diameter of about 100 mm.

As shown, an outer surface 602 of the cored semiconductor wafer 600 is formed from the coring operation using the one or more lasers. Specifically, the outer surface 602 extends circumferentially around the outer periphery of the cored semiconductor wafer 600 and from a top surface 604 of the cored semiconductor wafer 600 to a bottom surface 606 of the cored semiconductor wafer 600. Furthermore, as shown, the outer surface 602 has a flared edge 608 such that a bottom portion 610 of the outer surface 602 is wider than a top portion 612 of the outer surface 602. In this respect, and as described above, a grinding operation may be performed on the outer surface 602 to remove the flared edge 608, thereby forming a finished, flattened outer surface 602'. Thus, the grinding operation reduces a cored diameter 614 of the cored semiconductor wafer 600 to a finished semiconductor wafer diameter 616, which is smaller than the cored diameter 614. In some examples, the grinding operation may be implemented using a grind wheel with an abrasive-containing material. In some examples, the grinding operation may be implemented using one or more lasers.

Figure 13:
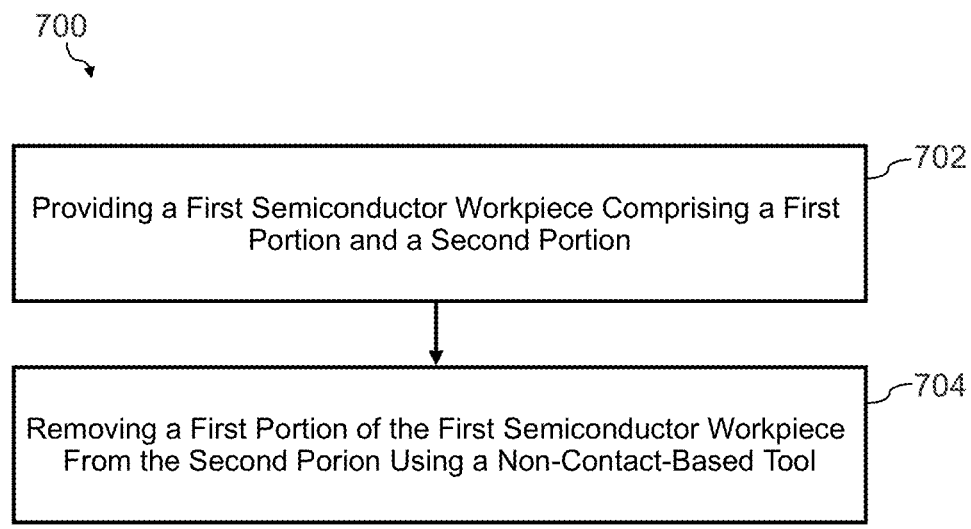
FIG. 13 depicts a flow chart diagram of an example method according to examples of the present disclosure.

FIG. 13 depicts a flow chart diagram of an example method 700 according to aspects of the present disclosure. The method 700 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 702, the method 700 includes providing a first semiconductor workpiece including a first portion and a second portion. The first portion of the first semiconductor workpiece may contain one or more defects. For example, the first portion may include one or more crystal growth defects, edge chip defects, over-edge grind defects, etc. Conversely, the second portion of the first semiconductor workpiece may generally be free of defects and is, thus, suitable for further processing to fabricate power semiconductor devices. In some examples, the first semiconductor workpiece is a wide bandgap semiconductor workpiece, such as a silicon carbide or Group-III nitride semiconductor wafer. In some examples, the first semiconductor workpiece is a semiconductor wafer. For instance, in some examples, the semiconductor wafer may be removed from a semiconductor boule using a removal process. Additionally, the first semiconductor wafer may be an unfinished wafer or a finished wafer. In other examples, the first semiconductor workpiece is a semiconductor boule.

At 704, the method 700 includes removing the first portion of the first semiconductor workpiece from the second portion using a non-contact-based tool. As such, the second portion has a shape corresponding to a second semiconductor workpiece of a different diameter relative to the first semiconductor workpiece. That is, the second semiconductor workpiece has a smaller diameter than the first semiconductor workpiece.

In some embodiments, the non-contact-based tool includes one or more laser sources, such as the laser sources 312 of the laser processing system 300 described above with reference to FIG. 8. In such embodiments, at 704, removing the first portion of the first semiconductor workpiece from the second portion may include ablating semiconductor material of the first semiconductor workpiece separating the first portion and the second portion with one or more lasers emitted by the one or more laser sources. In this regard, by ablating the semiconductor material separating the first portion and the second portion with the one or more lasers (i.e., coring the first semiconductor workpiece), the first portion of the first semiconductor workpiece can be removed or otherwise separated from the second portion, thereby forming the second semiconductor workpiece.

Figure 14:
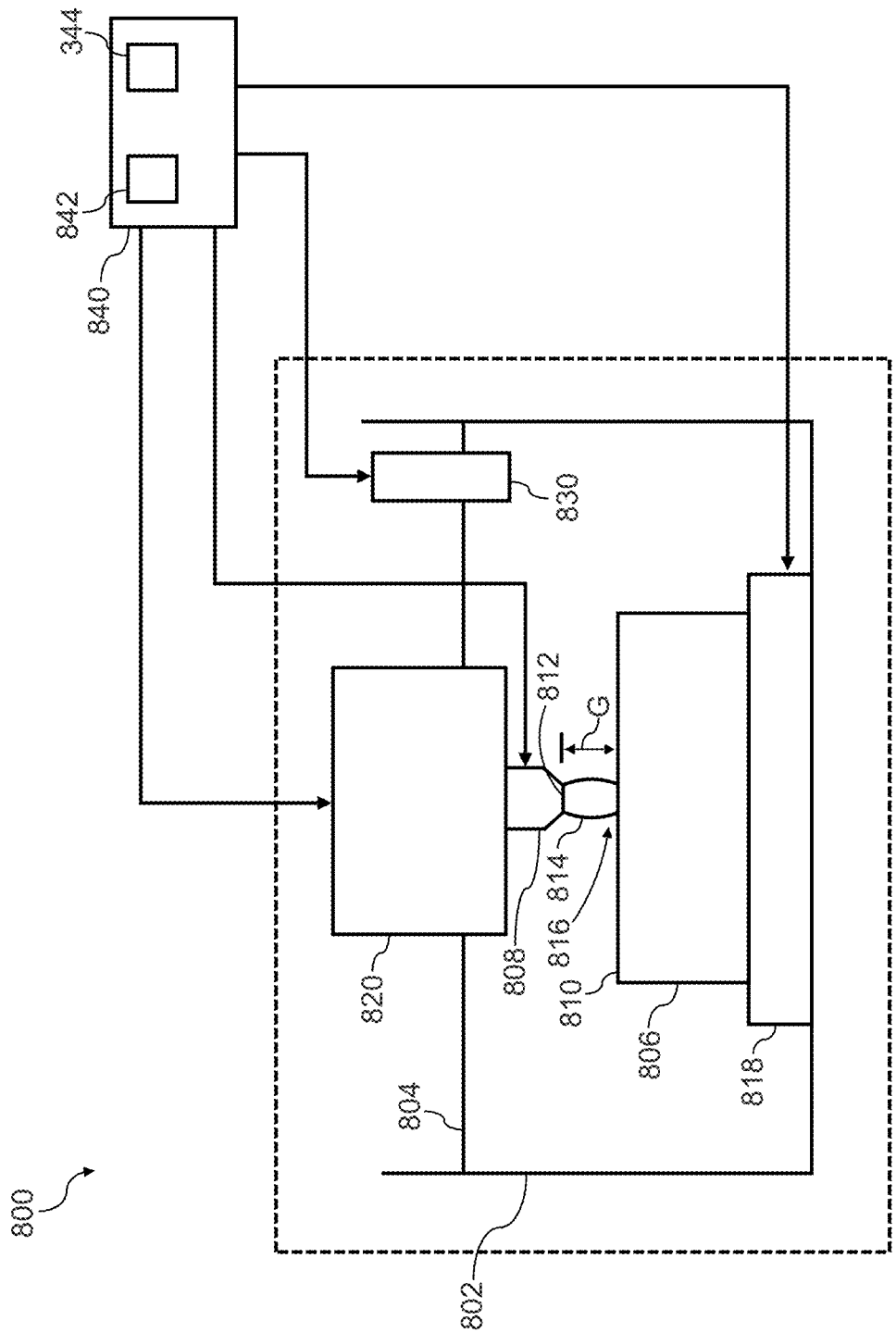
FIG. 14 depicts an example electrical discharge machining (EDM) system according to examples of the present disclosure.

In other embodiments, the non-contact-based tool includes an electrode head 808 of an electrical discharge machine (EDM) system, such as the EDM system 800 shown in FIG. 14. In such embodiments, at 704, removing the first portion of the first semiconductor workpiece from the second portion may include exposing the first semiconductor workpiece to one or more electrical discharges from the electrode head. In this regard, by exposing the semiconductor material separating the first portion and the second portion to the one or more electrical discharges (i.e., coring the first semiconductor workpiece), the first portion of the first semiconductor workpiece can be removed or otherwise separated from the second portion, thereby forming the second semiconductor workpiece.

FIG. 14 depicts an example EDM system 800 according to examples of the present disclosure. The EDM system 800 may be configured to implement one or more aspects of the present disclosure, such as the EDM-based removal processes and/or EDM-based surface processing operations disclosed herein.

The EDM system 800 includes a tank 802. In general, the tank 802 is operable to contain a dielectric fluid 804 and a semiconductor workpiece 806 submerged within the dielectric fluid 804. Thus, the tank 802 may have any suitable structure for containing a fluid, such as a plurality of walls defining a chamber suitable for receiving and holding a fluid (e.g., a liquid). In some embodiments, the dielectric fluid 804 may be oil, kerosene, paraffin, white spirit, deionized water, or similar fluid. In some examples, the dielectric fluid may have a conductivity in a range of about 0.1 uS/cm to about 1 uS/cm. Moreover, in some examples, the workpiece 806 may be a semiconductor wafer or a semiconductor boule.

Figure 15:
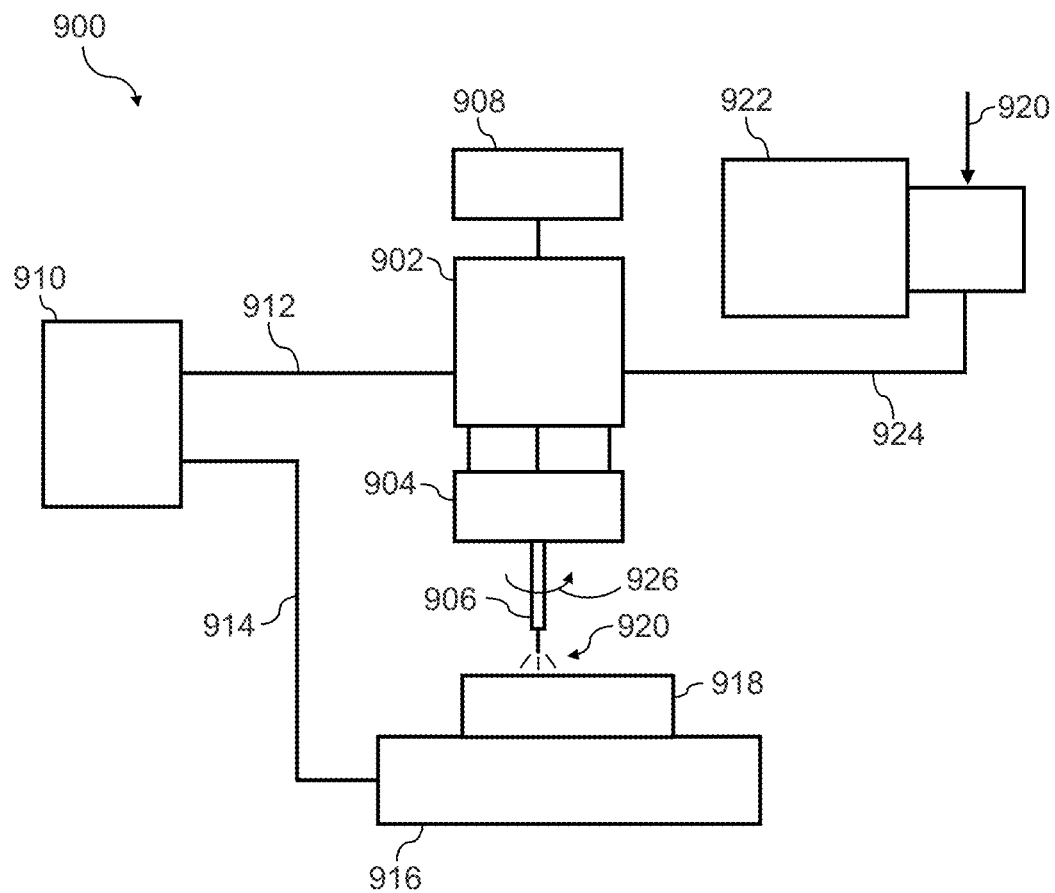
FIG. 15 depicts an example EDM machine according to examples of the present disclosure.

Furthermore, the EDM system 800 includes an electrode head 808. In general, the electrode head 808 may be operable to be positioned relative to a surface 810 of the semiconductor workpiece 806 to be processed such that a gap G is defined between an end 812 of the electrode head 808 and the surface 810. As such, when a bias voltage is supplied to the electrode head 808, an electrical discharge 814 is generated across the gap G, and a plasma zone 816 is created within the gap G that removes material from the surface 803. That is, the generation of the electrical discharge erodes the material present on the surface 810 of the semiconductor workpiece 806. In some embodiments, the EDM system 800 can include multiple electrode heads. FIG. 15 depicts an EDM machine 900 including an electrode head that can be incorporated into the EDM system 800.

In one example, the electrode head 808 may have any suitable length and any suitable width. For instance, in one example, the head 308 can have a length in a range of about 1 millimeter to about 200 millimeters, such as in the range of about 5 millimeters to about 10 millimeters. Moreover, in such an example, the head 308 can have a width in a range of about 1 millimeter to about 200 millimeters, such as in the range of about 5 millimeters to about 10 millimeters.

The electrode head 808 may have any suitable cross-sectional shape. For example, the cross-sectional shape of the electrode head 808 can be a rectangle, square, circle, hexagonal, etc.

The electrode head 808 may be constructed from any suitable material. The electrode head 808 can be metallic, non-metallic, or a combination of metallic and non-metallic. For example, the electrode head 808 can be constructed from copper, brass, graphite, copper tungsten, silver tungsten, copper graphite, and tungsten carbide.

The EDM system 800 includes a workpiece support 818 configured to support a semiconductor workpiece 806. The workpiece support 818 may include a chuck (e.g., vacuum chuck) or other mechanism to hold the workpiece 806 in place during EDM-based processing according to examples of the present disclosure.

The electrode head 808 may be coupled to a translation stage 820 that may move the electrode head 808 relative to the workpiece 806. Furthermore, the electrode head 808 may include one or more actuators (e.g., electric motors, electric linear actuators, etc.) to facilitate moving the electrode head 808 relative to the workpiece 806. In addition, or in the alternative, the workpiece support 818 may be operable to move the workpiece 806 relative to the electrode head 808. In this way, the system 800 may be able to control the translation stage 820 and/or the workpiece support 818 to impart relative motion (e.g., linear translation and/or rotational motion) between the electrode head 808 and the workpiece 806 to implement EDM-based removal processes according to examples of the present disclosure.

In some examples, the EDM system 800 may be controlled to remove material from the semiconductor workpiece 306 in accordance with various EDM system parameters. The EDM system parameters may include, for instance, the duration of the electrical pulse supplied to the electrode head 808, the current of the electrical pulse supplied to the electrode head 808, the translation speed, etc. In one example, the EDM system 800 may be controlled in accordance with the following EDM system parameters:
  Duration of the electrical pulse supplied to the electrode head: about 6 microseconds to about 100 microseconds, such as about 6 microseconds to about 50 microseconds;
  Peak current of the electrical pulse supplied to the electrode head: about 6 Amps to about 17 Amps, such as about 6 Amps to about 10 Amps;
  Discharge voltage: about 50 V to about 350 V, such as about 50 V to about 300 V, such as about 100 V to about 250 V.
  Pulse frequency: about 10 KHz to about 200 KHz; such as about 10 KHz to about 100 KHz
  Duty factor: about 50% to about 85%, such as about 50% to about 75%;
  Electrode or spark gap: about 5 microns to about 2000 microns, such as about 5 microns to about 1000 microns, such as about 100 microns to about 500 microns;
  Translation speed: about 1 millimeter per second to about 500 millimeters per second, such as about 1 millimeter per second to about 250 millimeters per second.

Other parameters that may be used to operate the EDM system 800 include the polarity (i.e., positive or negative), workpiece material, electrode material, electrode shape, and/or dielectric fluid type.

In some embodiments, the EDM system 800 may additionally include one or more sensors 830 for obtaining data associated with the workpiece 806, such as workpiece property data for the workpiece 806. The sensors 830 may be similar to the sensor 330 described above.

The EDM system 800 includes one or more control devices, such as a controller 840. The controller 840 may include one or more processors 842 and one or more memory devices 844. The controller 840 may be similar to the controller 340.

In some embodiments, the controller 340 may control aspects of the EDM system 800 (e.g., the electrode head 808) based at least in part on data from the sensor(s) 830. For instance, the controller 840 may adjust various EDM system parameters for generating electrical discharges 814 with the electrode head 808 based at least in part on data from the sensor(s) 830. The EDM system parameters may include, for instance, one or more of the duration of the electrical pulses supplied to the electrode head 808, the current of the electrical pulse supplied to the electrode head 808, and/or the scan pattern. The controller 840 may be configured to adjust the EDM system parameters based on sensor data associated with a current workpiece 806 undergoing an EDM-based surface processing operation (e.g., dynamic adjustment during or after an EDM-based surface processing operation) or based on sensor data associated with past semiconductor workpieces that had previously undergone an EDM-based surface processing operation. In some embodiments, the electrode head 808 may include one or more actuators (e.g., to move the electrode head 808 relative to the workpiece 806), one or more power control devices (e.g., one or more switches, transformers, etc. to adjust the duration or current of the electric pulse being supplied to the electrode head 808), etc.

FIG. 15 depicts an example EDM machine 900 according to examples of the present disclosure. The EDM machine 900 may be configured to implement one or more aspects of the present disclosure, such as the EDM-based removal processes and/or EDM-based surface processing operations disclosed herein.

The EDM machine 900 machine includes an electrode holder 902 and an electrode head 904 coupled to the electrode holder 902. The electrode head 904, in turn, can include an electrode 906. In this respect, the electrode holder 802 can support the electrode head 904 to position the electrode 906 relative to a semiconductor workpiece 918 (e.g., a semiconductor wafer or a semiconductor boule) such that a gap is defined between the electrode 906 and the semiconductor workpiece 918.

Additionally, the EDM machine 900 can include a servo motor 908 operable to move the electrode holder 902 (and, thus, the electrode head 904 and the electrode 906) relative to the semiconductor workpiece 918. Alternatively, or additionally, the servo motor 908 may be operable to rotationally drive the electrode 906 relative to the electrode holder 902 and/or the electrode head 904 (e.g., as indicated by arrow 926 in FIG. 15). Moreover, the servo motor 908 can maintain a constant gap between the electrode 906 and the semiconductor workpiece 918.

Furthermore, the EDM machine 900 includes an EDM generator 910. As shown, the EDM generator 910 can be electrically coupled to the electrode 906 via an electrical conduit 912. Moreover, the EDM generator 910 can be electrically coupled to a workpiece support 916 on which the semiconductor workpiece 918 is supported via an electrical conduit 914. As such, the EDM generator 910 can generate the voltage and/or electrical current flow necessary for creating one or more sparks in the gap defined between the electrode 906 and the workpiece 918.

In addition, the EDM machine 900 includes a pump 922. In general, the pump 922 is operable to pump or otherwise cause a dielectric fluid 820 to flow from a dielectric fluid supply to the electrode 906. Specifically, the pump 922 may be operable to pump the dielectric fluid 920 through a fluid conduit 924 (e.g., a pipe or hose) to the electrode 906. Thereafter, the dielectric fluid 920 can be discharged through and/or around the periphery of the electrode 906 for delivery to the semiconductor workpiece 918.

Example aspects of the present disclosure are set forth below. Any of the below features or examples may be used in combination with any of the embodiments or features provided in the present disclosure.

In an aspect, the present disclosure provides an example method. In some implementations, the example method includes providing a first semiconductor workpiece comprising a first portion and a second portion. In some implementations, the example method includes providing emission of one or more lasers through a thickness of the first semiconductor workpiece to remove the first portion of the first semiconductor workpiece from the second portion. In some implementations, the second portion has a shape corresponding to a second semiconductor workpiece of a different diameter relative to the first semiconductor workpiece.

In some implementations of the example method, providing emission of the one or more lasers through the thickness of the first semiconductor workpiece includes ablating semiconductor material of the first semiconductor workpiece separating the first portion and the second portion with the one or more lasers.

In some implementations of the example method, the first semiconductor workpiece includes a wide bandgap semiconductor.

In some implementations of the example method, the first semiconductor workpiece includes silicon carbide.

In some implementations of the example method, the first semiconductor workpiece includes a Group III-nitride.

In some implementations of the example method, the first semiconductor workpiece is a semiconductor wafer.

In some implementations of the example method, the semiconductor wafer is a finished wafer.

In some implementations of the example method, the semiconductor wafer is an unfinished wafer.

In some implementations of the example method, the first semiconductor workpiece has a diameter of about 200 mm and the second semiconductor workpiece has a diameter of about 150 mm.

In some implementations of the example method, the first semiconductor workpiece has a diameter of about 150 mm and the second semiconductor workpiece has a diameter of about 100 mm.

In some implementations of the example method, the first semiconductor workpiece has a diameter of about 200 mm and the second semiconductor workpiece has a diameter of about 100 mm.

In some implementations of the example method, the first semiconductor workpiece is a semiconductor boule.

In some implementations of the example method, after providing emission of the one or more lasers through the thickness of the first semiconductor workpiece, the example method includes an outer surface of the second semiconductor workpiece having a flared edge.

In some implementations of the example method, the example method includes grinding the outer surface of the second semiconductor workpiece reduces a diameter of the second semiconductor workpiece to a finished workpiece diameter.

In some implementations of the example method, the first portion includes a crystal growth defect.

In some implementations of the example method, the first portion includes an edge chip defect.

In some implementations of the example method, the first portion includes an over-edge grind defect.

In some implementations of the example method, the one or more lasers have a wavelength in a range of about 500 nanometers to about 1100 nanometers.

In some implementations of the example method, providing emission of the one or more lasers through the thickness of the first semiconductor workpiece includes providing emission of the one or more lasers at a laser power in a range of about 0.1 watts to about 500 watts.

In some implementations of the example method, providing emission of the one or more lasers through the thickness of the first semiconductor workpiece includes imparting relative motion between the first semiconductor workpiece and the one or more lasers.

In some implementations, the example method includes obtaining data indicative of a workpiece property. In some implementations, the example method includes determining one or more laser parameters based on the workpiece property. In some implementations, the example method includes providing emission of the one or more lasers through the thickness of the first semiconductor workpiece based at least in part on the one or more laser parameters.

In some implementations of the example method, determining the one or more laser parameters includes identifying the first portion of the first semiconductor workpiece based on the workpiece property. In some implementations of the example method, determining the one or more laser parameters includes determining a cut line separating the first portion from the second portion based at least in part on the identification of the first portion.

In some implementations of the example method, the data indicative of the workpiece property is obtained from an optical sensor.

In some implementations of the example method, the data indicative of the workpiece property includes an image.

In some implementations of the example method, the one or more laser parameters include one or more of laser power, laser wavelength, laser pulse energy, laser pulse duration, or translation speed.

In some implementations of the example method, the one or more laser parameters are specified as a function of position on the first semiconductor workpiece.

In an aspect, the present disclosure provides an example method of processing a first semiconductor workpiece. In some implementations, the example method includes obtaining data indicative of a workpiece property. In some implementations, the example method includes determining one or more laser parameters based on the workpiece property. In some implementations, the example method includes providing emission of one or more lasers through a thickness of the first semiconductor workpiece to remove a first portion of the first semiconductor workpiece from a second portion of the first semiconductor workpiece based at least in part on the laser parameters.

In some implementations of the example method, determining the one or more laser parameters includes identifying the first portion of the first semiconductor workpiece based on the workpiece property. In some implementations of the example method, determining the one or more laser parameters includes determining a cut line separating the first portion from the second portion of the first semiconductor workpiece based at least in part on the identification of the first portion.

In some implementations of the example method, the data indicative of the workpiece property is obtained from an optical sensor.

In some implementations of the example method, the data indicative of the workpiece property includes an image.

In some implementations of the example method, the one or more laser parameters include one or more of laser power, laser wavelength, or translation speed.

In some implementations of the example method, the one or more laser parameters are specified as a function of position on the first semiconductor wafer.

In some implementations of the example method, the first semiconductor workpiece includes a wide bandgap semiconductor workpiece.

In some implementations of the example method, the wide bandgap semiconductor workpiece includes silicon carbide.

In some implementations of the example method, the wide bandgap semiconductor workpiece includes a Group III-nitride.

In an aspect, the present disclosure provides an example system. In some implementations, the example system includes a laser source configured to emit a laser to remove semiconductor material from a first semiconductor workpiece. In some implementations, the example system includes a translation stage operable to impart relative motion between the first semiconductor workpiece and the laser. In some implementations, the example system includes a sensor operable to obtain data indicative of a workpiece property. In some implementations, the example system includes a controller configured to perform operations, the operations including controlling the laser source to emit the laser through a thickness of the first semiconductor workpiece to remove a first portion of the first semiconductor workpiece from a second portion based at least in part on one or more laser parameters.

In some implementations of the example system, the operations further include determining one or more laser parameters based on the workpiece property.

In some implementations of the example system, when determining the one or more laser parameters, the operations include identifying the first portion of the first semiconductor workpiece based on the workpiece property. In some implementations of the example system, when determining the one or more laser parameters, the operations include determining a cut line separating the first portion from the second portion of the first semiconductor workpiece based at least in part on the identification of the first portion.

In some implementations of the example system, the first portion includes a crystal growth defect.

In some implementations of the example system, the first portion includes an edge chip defect.

In some implementations of the example system, the first portion includes an over-edge grind defect.

In some implementations of the example system, the one or more laser parameters includes one or more of laser power, laser wavelength, or translation speed.

In some implementations of the example system, the one or more laser parameters are specified as a function of position on the first semiconductor wafer.

In some implementations of the example system, the sensor is an optical sensor.

In some implementations of the example system, the sensor is an image capture device.

In some implementations of the example system, the first semiconductor workpiece includes a wide bandgap semiconductor.

In some implementations of the example system, the wide bandgap semiconductor includes silicon carbide.

In some implementations of the example system, the wide bandgap semiconductor includes a Group III-nitride.

In some implementations of the example system, the first semiconductor workpiece is a semiconductor wafer.

In some implementations of the example system, the first semiconductor workpiece is a semiconductor boule.

In some implementations of the example system, the laser source is configured to emit the laser such that the laser has a wavelength in a range of about 500 nanometers to about 1100 nanometers.

In some implementations of the example system, the laser source is configured to emit the laser at a laser power in a range of about 0.1 watts to about 500 watts.

In an aspect, the present disclosure provides an example cored semiconductor wafer. In some implementations, the example cored semiconductor wafer includes a silicon carbide. In some implementations, the example cored semiconductor wafer includes an outer surface formed from a coring operation using one or more lasers, the outer surface having a flared edge such that a bottom portion of the outer surface is wider than a top portion of the outer surface.

In some implementations of the example cored semiconductor wafer, the cored semiconductor wafer has a diameter of about 150 mm.

In some implementations of the example cored semiconductor wafer, the cored semiconductor wafer has a diameter of about 100 mm.

In an aspect, the present disclosure provides an example method for fabricating a semiconductor workpiece. In some implementations, the example method includes providing a first semiconductor workpiece comprising a first portion and a second portion. In some implementations, the example method includes removing the first portion of the first semiconductor workpiece from the second portion using a non-contact-based tool. In some implementations of the example method, the second portion has a shape corresponding to a second semiconductor workpiece of a different diameter relative to the first semiconductor workpiece.

In some implementations of the example method, the non-contact-based tool includes one or more laser sources.

In some implementations of the example method, removing the first portion of the first semiconductor workpiece from the second portion includes ablating semiconductor material of the first semiconductor workpiece separating the first portion and the second portion with one or more lasers emitted from the one or more laser sources.

In some implementations of the example method, the non-contact-based tool includes an electrode head of an electrical discharge machining (EDM) system.

In some implementations of the example method, removing the first portion of the first semiconductor workpiece from the second portion includes exposing the first semiconductor workpiece to one or more electrical discharges from the electrode head.

In some implementations of the example method, the first semiconductor workpiece includes a wide bandgap semiconductor.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for fabricating a semiconductor workpiece, comprising:
   providing a first semiconductor workpiece comprising a first portion and a second portion;
   identifying the first portion of the semiconductor workpiece based on a workpiece property present in the first portion of the semiconductor workpiece; and
   providing emission of one or more lasers through a thickness of the first semiconductor workpiece to remove the first portion of the first semiconductor workpiece from the second portion;
   wherein the second portion has a shape corresponding to a second semiconductor workpiece of a different diameter relative to the first semiconductor workpiece;
   wherein providing emission of one or more lasers comprises determining a cut line separating the first portion from the second portion based at least in part on the identification of the first portion.

2. The method of claim 1, wherein providing emission of the one or more lasers through the thickness of the first semiconductor workpiece comprises ablating semiconductor material of the first semiconductor workpiece separating the first portion and the second portion with the one or more lasers.

3. The method of claim 1, wherein the first semiconductor workpiece comprises a wide bandgap semiconductor.

4. The method of claim 1, wherein the first semiconductor workpiece comprises silicon carbide.

5. The method of claim 1, wherein the first semiconductor workpiece comprises a Group III-nitride.

6. The method of claim 1, wherein the first semiconductor workpiece is a semiconductor wafer.

7. The method of claim 1, wherein the first semiconductor workpiece is a semiconductor boule.

8. The method of claim 1, wherein after providing emission of the one or more lasers through the thickness of the first semiconductor workpiece, an outer surface of the second semiconductor workpiece has a flared edge.

9. The method of claim 8, further comprising: grinding the outer surface of the second semiconductor workpiece after providing emission of the one or more lasers through the thickness of the first semiconductor workpiece.

10. The method of claim 9, wherein grinding the outer surface of the second semiconductor workpiece reduces a diameter of the second semiconductor workpiece to a finished workpiece diameter.

11. The method of claim 1, wherein the first portion comprises a crystal growth defect.

12. The method of claim 1, wherein the first portion comprises an edge chip defect.

13. The method of claim 1, wherein the first portion comprises an over-edge grind defect.

14. The method of claim 1, wherein providing emission of the one or more lasers through the thickness of the first semiconductor workpiece comprises imparting relative motion between the first semiconductor workpiece and the one or more lasers.

15. The method of claim 1, further comprising:
    obtaining data indicative of a workpiece property;
    determining one or more laser parameters based on data indicative of the workpiece property; and
    providing emission of the one or more lasers through the thickness of the first semiconductor workpiece based at least in part on the one or more laser parameters.

16. The method of claim 15, wherein the one or more laser parameters comprise one or more of laser power, laser wavelength, laser pulse energy, laser pulse duration, or translation speed.

17. The method of claim 15, wherein the one or more laser parameters are specified as a function of position on the first semiconductor workpiece.

18. The method of claim 1, wherein the first semiconductor workpiece has a diameter of about 200 mm and the second semiconductor workpiece has a diameter of about 150 mm.

19. The method of claim 1, wherein the first semiconductor workpiece has a diameter of about 200 mm and the second semiconductor workpiece has a diameter of about 100 mm.

* * * * *